(12) United States Patent
Kuroki et al.

(10) Patent No.: US 12,346,009 B2
(45) Date of Patent: Jul. 1, 2025

(54) IMAGING DEVICE WITH HEAT DISSIPATION MECHANISM

(71) Applicant: Panasonic Intellectual Property Management Co., Ltd., Osaka (JP)

(72) Inventors: Hiroyuki Kuroki, Osaka (JP); Hikaru Tsuchitani, Osaka (JP); Yuuji Matsuo, Osaka (JP); Norikazu Kaneda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/877,131

(22) Filed: Jul. 29, 2022

(65) Prior Publication Data

US 2023/0035644 A1    Feb. 2, 2023

(30) Foreign Application Priority Data

Aug. 2, 2021 (JP) ................ 2021-126849

(51) Int. Cl.
| | |
|---|---|
| *G03B 17/55* | (2021.01) |
| *G03B 17/56* | (2021.01) |
| *H04N 23/51* | (2023.01) |
| *H04N 23/52* | (2023.01) |
| *H04N 23/53* | (2023.01) |
| *H05K 7/20* | (2006.01) |

(52) U.S. Cl.
CPC ........... *G03B 17/55* (2013.01); *G03B 17/563* (2013.01); *H04N 23/51* (2023.01); *H04N 23/52* (2023.01); *H04N 23/53* (2023.01); *H05K 7/20145* (2013.01); *H05K 7/20154* (2013.01); *H05K 7/2039* (2013.01)

(58) Field of Classification Search
CPC ...... G03B 17/55; G03B 17/563; H04N 23/51; H04N 23/52; H04N 23/53; H05K 7/20145; H05K 7/20154; H05K 7/2039
See application file for complete search history.

(56) References Cited

U.S. PATENT DOCUMENTS

| | | | |
|---|---|---|---|
| 2,272,046 A | 2/1942 | Findley | |
| 5,300,976 A * | 4/1994 | Lim | ............ H04N 23/63 |
| | | | 352/138 |
| 5,332,031 A | 7/1994 | Kiga | |

(Continued)

FOREIGN PATENT DOCUMENTS

| | | |
|---|---|---|
| JP | H05-292366 A | 11/1993 |
| JP | 2006-340214 A | 12/2006 |

(Continued)

OTHER PUBLICATIONS

Commonly owned, co-pending U.S. Appl. No. 18/074,484, filed Dec. 4, 2022.

(Continued)

*Primary Examiner* — Chiawei Chen
(74) *Attorney, Agent, or Firm* — Renner, Otto, Boisselle & Sklar, LLP

(57) ABSTRACT

An imaging device includes: a heat source; a heat dissipation mechanism for dissipating heat of the heat source; and a main body to which the heat source and the heat dissipation mechanism are attached, wherein the heat dissipation mechanism is disposed on an outer peripheral portion of the main body.

13 Claims, 26 Drawing Sheets

(56) References Cited

U.S. PATENT DOCUMENTS

| | | | | |
|---|---|---|---|---|
| 5,951,137 | A * | 9/1999 | Bortz | G03B 21/16 |
| | | | | 353/96 |
| 6,135,714 | A * | 10/2000 | Hsu | F04D 29/601 |
| | | | | 416/247 R |
| 10,462,929 | B1 * | 10/2019 | Su | H01Q 13/10 |
| 10,842,042 | B2 * | 11/2020 | Kim | G08B 13/19634 |
| 11,852,834 | B1 * | 12/2023 | Wang | G02B 27/0179 |
| 2003/0184717 | A1 * | 10/2003 | Kim | G03B 21/16 |
| | | | | 353/119 |
| 2006/0290893 | A1 * | 12/2006 | Lim | G03B 21/16 |
| | | | | 353/57 |
| 2008/0074509 | A1 | 3/2008 | Sano | |
| 2009/0016710 | A1 * | 1/2009 | Nozaki | H04N 23/50 |
| | | | | 348/E5.025 |
| 2010/0059211 | A1 * | 3/2010 | Li | H01L 23/467 |
| | | | | 416/175 |
| 2014/0307088 | A1 * | 10/2014 | DeJesus | G08B 13/1963 |
| | | | | 348/143 |
| 2016/0295095 | A1 * | 10/2016 | Jannard | H05K 7/20172 |
| 2017/0070681 | A1 * | 3/2017 | Nattress | G09G 5/10 |
| 2017/0346996 | A1 * | 11/2017 | Kida | H04N 23/51 |
| 2018/0054542 | A1 | 2/2018 | Petty et al. | |
| 2018/0084194 | A1 * | 3/2018 | Woodman | H04N 23/65 |
| 2019/0239383 | A1 * | 8/2019 | Kim | H05K 7/20154 |
| 2019/0335075 | A1 * | 10/2019 | Ueda | H01Q 1/22 |
| 2020/0036852 | A1 | 1/2020 | Petty | |
| 2020/0110449 | A1 | 4/2020 | Chang | |
| 2020/0120250 | A1 | 4/2020 | Colin | |
| 2020/0288048 | A1 * | 9/2020 | Makara | H05K 7/20209 |
| 2020/0288586 | A1 * | 9/2020 | Lu | B64C 39/024 |
| 2020/0344922 | A1 * | 10/2020 | Wada | H05K 7/20172 |
| 2021/0055631 | A1 | 2/2021 | Mano et al. | |
| 2021/0153381 | A1 * | 5/2021 | Naito | G03B 21/16 |
| 2021/0181599 | A1 | 6/2021 | Shum | |
| 2021/0302057 | A1 * | 9/2021 | Lozano | F24F 13/0254 |
| 2021/0306538 | A1 * | 9/2021 | Solar | H04N 23/52 |
| 2021/0333847 | A1 * | 10/2021 | Yang | H05K 7/20154 |
| 2022/0030150 | A1 | 1/2022 | Obana | |
| 2022/0294954 | A1 * | 9/2022 | Ishii | G03B 17/55 |
| 2022/0294955 | A1 * | 9/2022 | Yoshida | G03B 17/561 |
| 2022/0294956 | A1 * | 9/2022 | Tamura | H04N 23/52 |
| 2023/0035644 | A1 | 2/2023 | Kuroki et al. | |
| 2023/0266645 | A1 | 8/2023 | Ueda | |
| 2023/0320048 | A1 * | 10/2023 | Jang | H05K 7/20172 |
| | | | | 361/816 |

FOREIGN PATENT DOCUMENTS

| | | |
|---|---|---|
| JP | 2012-047798 A | 3/2012 |
| JP | 2013-175959 A | 9/2013 |
| JP | 2014-081504 A | 5/2014 |
| JP | 2019-057887 A | 4/2019 |
| JP | 2019-179949 A | 10/2019 |
| JP | 2019-191433 A | 10/2019 |
| WO | 2015/025687 A1 | 2/2015 |

OTHER PUBLICATIONS

Office Action for related U.S. Appl. No. 18/074,484 dated Jun. 20, 2024.

Office Action for related U.S. Appl. No. 18/074,484 dated Sep. 26, 2024.

Notice of Allowance for related U.S. Appl. No. 18/074,484 dated Jan. 17, 2025.

Office Action for corresponding Japanese Application No. 2021-126849 dated Jan. 7, 2025 and its English Machine Translation.

Office Action for corresponding Japanese Application No. 2021-126849 dated May 27, 2025 and its English Machine Translation.

* cited by examiner

IMAGING DEVICE WITH HEAT DISSIPATION MECHANISM

BACKGROUND OF THE INVENTION

Field of the Invention

The present disclosure relates to an imaging device that captures an image of a subject.

Description of the Related Art

Japanese Patent Laid-open Publication No. 2019-057887 discloses an imaging device that captures an image of the subject. The imaging device of Japanese Patent Laid-open Publication No. 2019-057887 includes heat sources such as an image sensor and an image engine, and various heat dissipation mechanisms for dissipating heat generated from these heat sources have been proposed.

With the recent trend of higher image quality and higher performance and the use of moving images, the heat generated by the heat sources such as the image sensor and the image engine also tends to increase significantly. While stop of operation of the imaging device due to overheating is likely to be a problem, various members such as a heat sink and a fan are required for the heat dissipation mechanism capable of dissipating a large amount of heat, and the imaging device tends to be large in size, which may damage designability. In the imaging device having various heat sources, there is room for improvement in achieving both heat dissipation and designability.

SUMMARY OF THE INVENTION

The present disclosure provides an imaging device that easily achieves both heat dissipation and designability.

An imaging device according to the present disclosure includes a heat source, a heat dissipation mechanism for dissipating heat of the heat source, and a main body to which the heat source and the heat dissipation mechanism are attached, in which the heat dissipation mechanism is disposed on an outer peripheral portion of the main body.

According to the imaging device of the present disclosure, it is easy to achieve both heat dissipation and designability.

DESCRIPTION OF THE PREFERRED EMBODIMENTS

Hereinafter, embodiments will be described in detail with reference to the drawings as appropriate. However, unnecessarily detailed description may be omitted. For example, a detailed description of a well-known matter and a repeated description of substantially the same configuration may be omitted. This is to avoid unnecessary redundancy of the following description and to facilitate understanding of those skilled in the art. Note that the inventors provide the accompanying drawings and the following description in order for those skilled in the art to fully understand the present disclosure, and do not intend to limit the subject matter described in the claims by the accompanying drawings and the following description.

First Embodiment

In a first embodiment, a digital camera will be described as an example of an imaging device according to the present disclosure.

A configuration of an imaging device 2 according to the first embodiment will be described with reference to FIGS. 1 and 2. Hereinafter, a left-right direction as viewed from a user using the imaging device 2 is defined as an X-axis direction, a front-rear direction is defined as a Y-axis direction, and an up-down direction is defined as a Z-axis direction. Terms indicating directions such as "upper", "lower", "front", "rear", "left", and "right" are used, but it does not mean to limit a use state or the like of the imaging device of the present disclosure.

Figure 1:
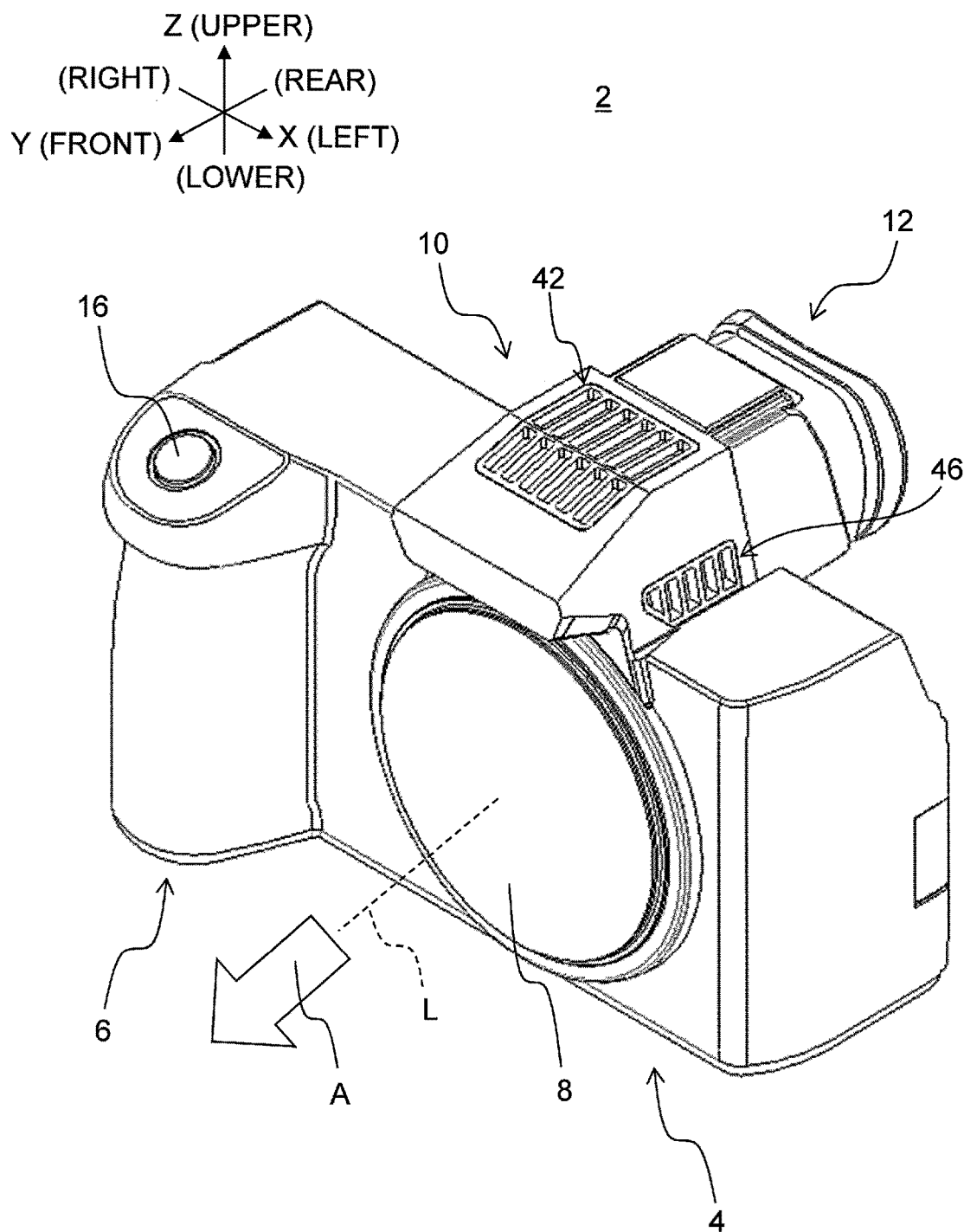
FIG. 1 is a perspective view of an imaging device according to a first embodiment of the present disclosure.
Figure 2:
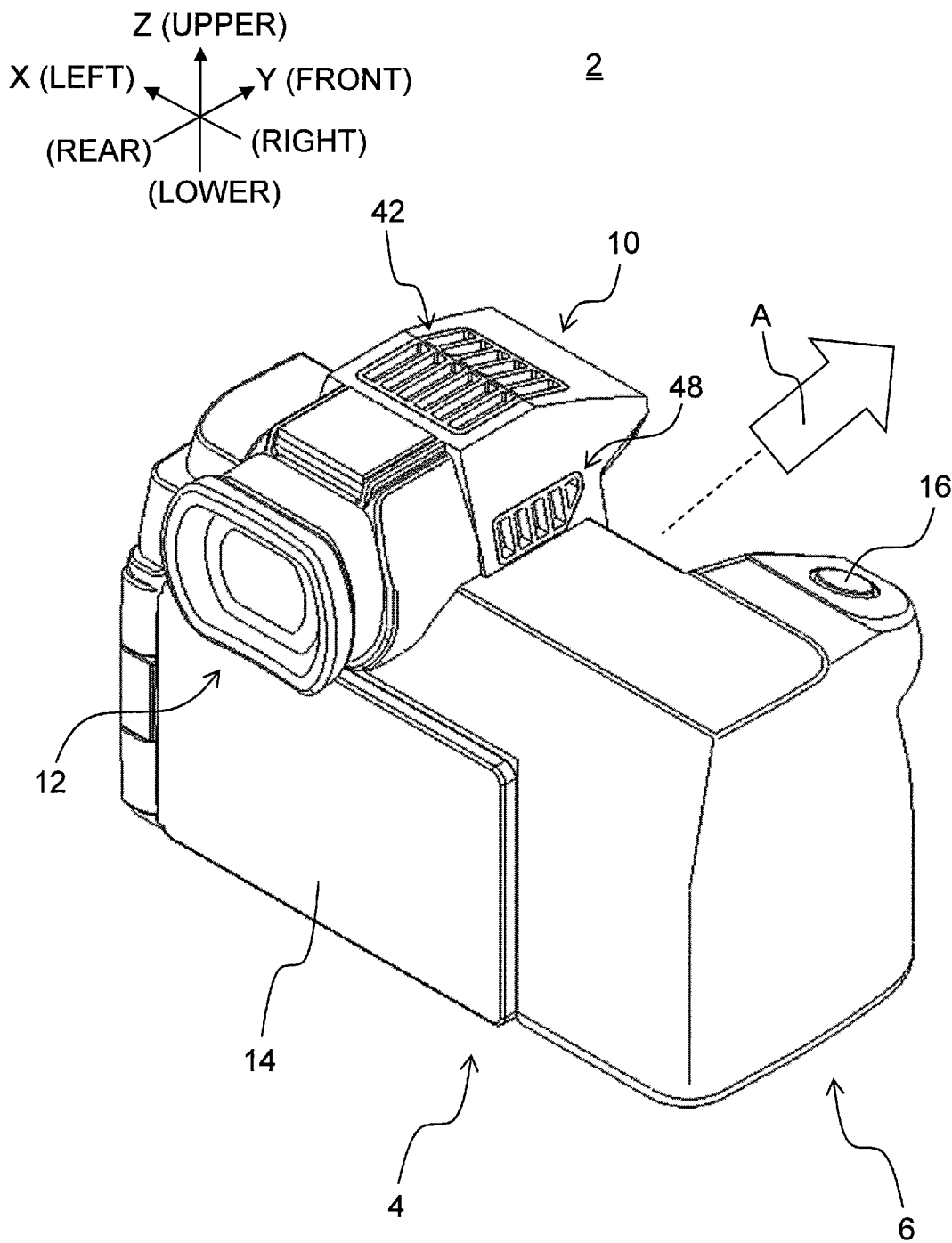
FIG. 2 is a perspective view of the imaging device according to the first embodiment.

FIGS. 1 and 2 are schematic perspective views of the imaging device 2 according to the first embodiment. The imaging device 2 illustrated in FIGS. 1 and 2 includes an imaging main body 4 and a grip 6.

The imaging main body 4 is a portion for capturing an image of a subject using a lens (not illustrated). The imaging main body 4 incorporates various components such as an image sensor and an image engine to be described later, and captures an image of the subject (not illustrated) positioned on a front side in an imaging direction A (that is, the Y-axis direction) along an optical axis L.

Figure 23:
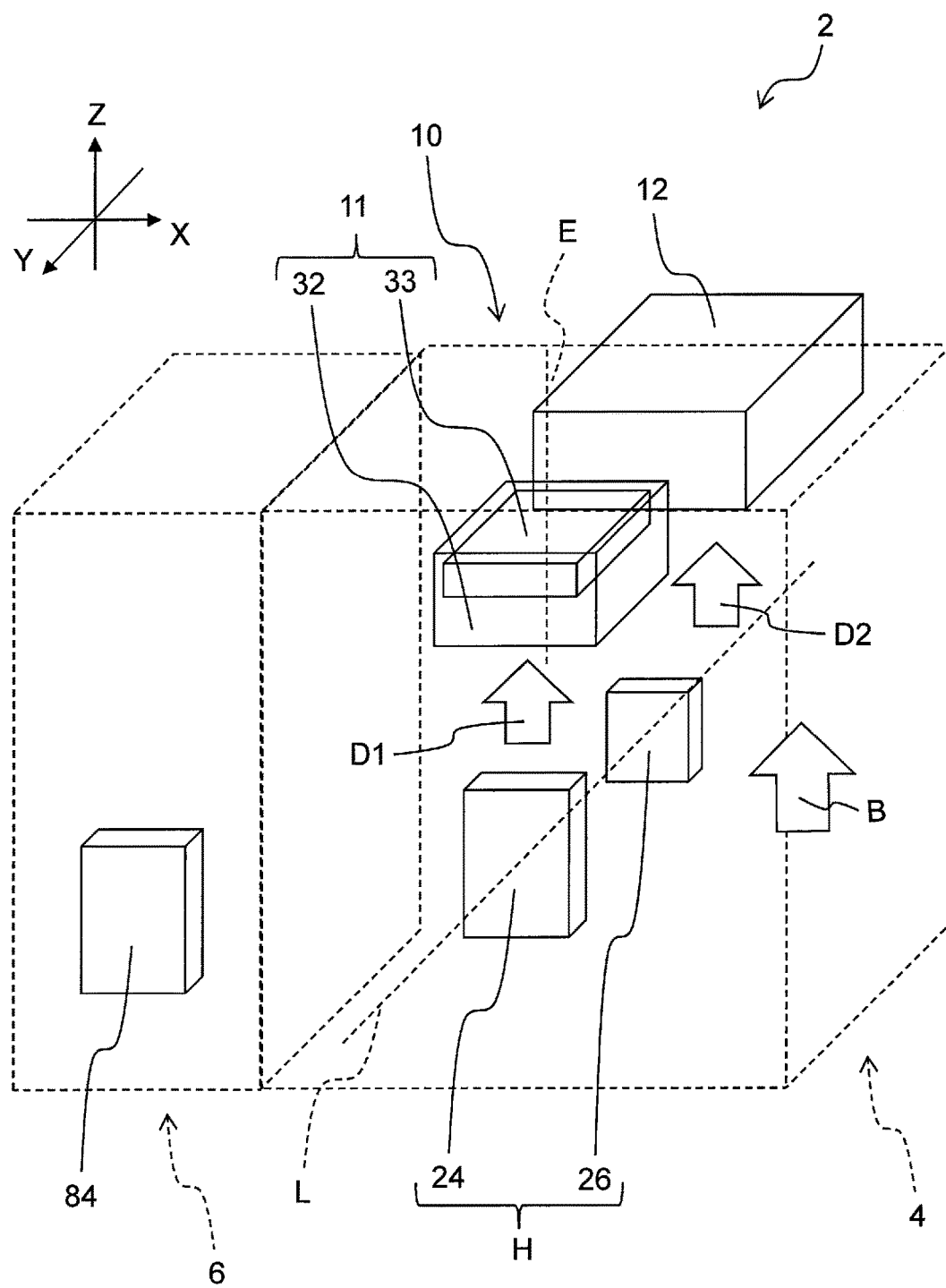
FIG. 23 is a perspective view schematically illustrating the layout of the imaging device according to the first embodiment.

The grip 6 is a portion for the user to grip the imaging device 2. The grip 6 is provided on a side (that is, right side in the first embodiment) of main body 4. A release button 16 is provided on an upper surface of the grip 6. A gyro sensor 84 (as shown in FIG. 23) to be described later is built in the grip 6. The grip 6 of the first embodiment is formed integrally with the imaging main body 4, but may be detachable.

As illustrated in FIGS. 1 and 2, the imaging main body 4 includes a lens cap 8 (as shown in FIG. 1), a heat dissipation mechanism 10, an EVF unit 12, and a monitoring unit 14 (as shown in FIG. 2).

The lens cap 8 is a member that covers a lens attachment portion (not illustrated) for attaching an interchangeable lens. Various lenses can be attached to the lens attachment portion covered by the lens cap 8. The heat dissipation mechanism 10 is a mechanism for dissipating heat of a heat source such as the image sensor or the image engine built in the imaging main body 4. The heat dissipation mechanism 10 of the first embodiment is located at a central upper portion (directly above the optical axis L) of the imaging main body 4 and is disposed at a position on a front surface side corresponding to a so-called "penta portion". A detailed configuration of the heat dissipation mechanism 10 will be described later.

An electronic view finder (that is, EVF) unit 12 is a unit that displays an image (that is, a through-image) captured by the imaging device 2 in a finder. The monitoring unit 14 illustrated in FIG. 2 is a monitor that displays the image (that is, through-image) captured by the imaging device 2. Posture of the monitoring unit 14 can be changed by a variable angle mechanism.

Figure 3:
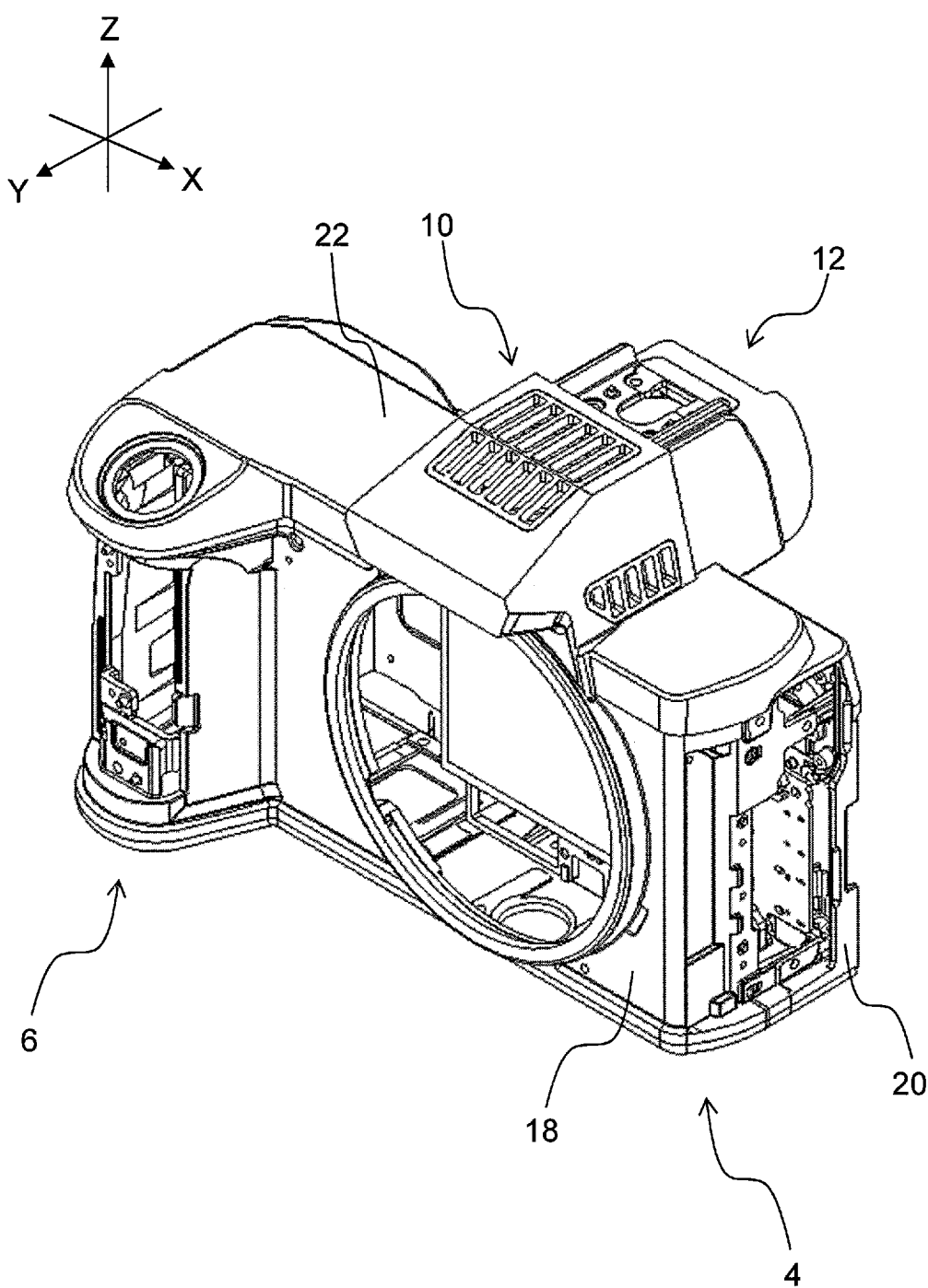
FIG. 3 is a perspective view illustrating an internal configuration of an imaging main body and a grip according to the first embodiment.
Figure 4:
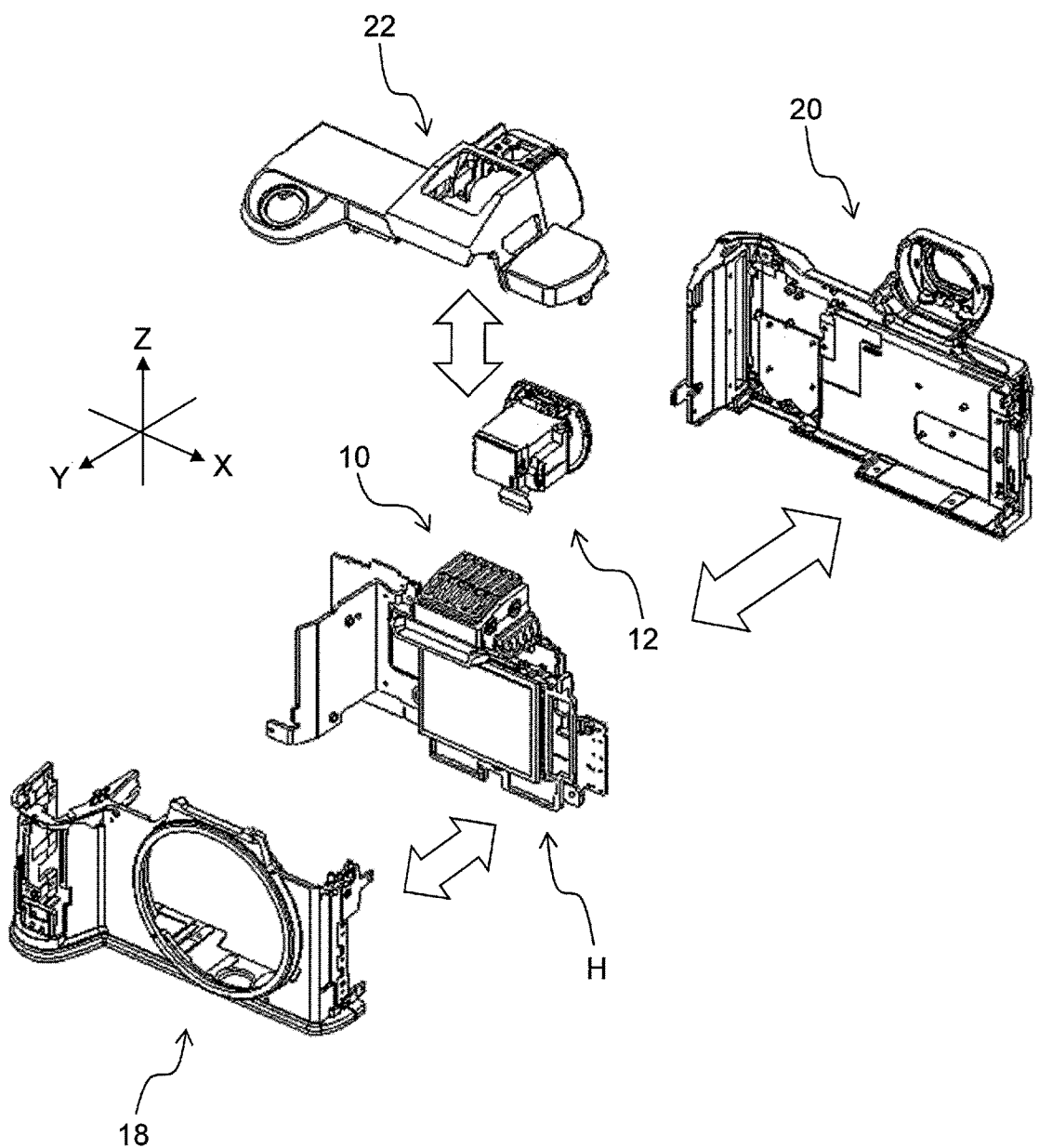
FIG. 4 is an exploded perspective view illustrating the internal configuration of the imaging main body and the grip according to the first embodiment.

FIG. 3 is a perspective view illustrating an internal configuration of the imaging main body 4 and the grip 6, and FIG. 4 is an exploded perspective view of the internal configuration. In FIGS. 3 and 4, only necessary members are illustrated, and illustration of other members is omitted.

As illustrated in FIGS. 3 and 4, the imaging main body 4 and the grip 6 include a front case 18, a rear case 20, and a top case 22. The front case 18 is disposed on a front side, the rear case 20 is disposed on a rear side, and the top case 22 is disposed on an upper side. The front case 18, the rear case 20, and the top case 22 are fixed to each other by screwing.

As illustrated in FIG. 4, a heat source H is attached to the front case 18. The heat dissipation mechanism 10 for dissipating heat from the heat source H is connected to the heat source H, and a part of the configuration of the heat dissipation mechanism 10 is disposed inside the top case 22. The heat source H and the heat dissipation mechanism 10 will be described with reference to FIGS. 5 and 6.

Figure 5:
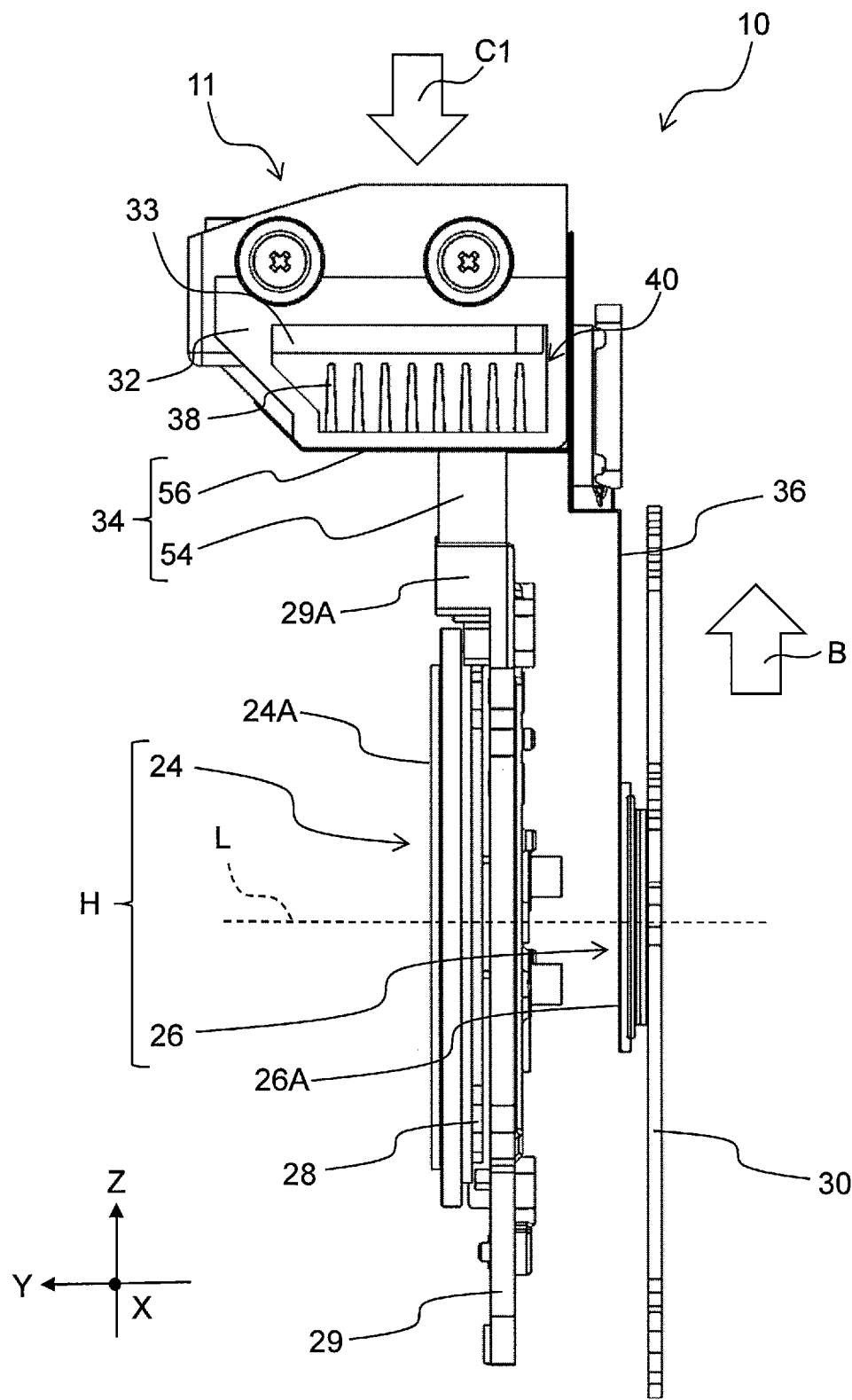
FIG. 5 is a side view illustrating a heat source and a heat dissipation mechanism according to the first embodiment.
Figure 6:
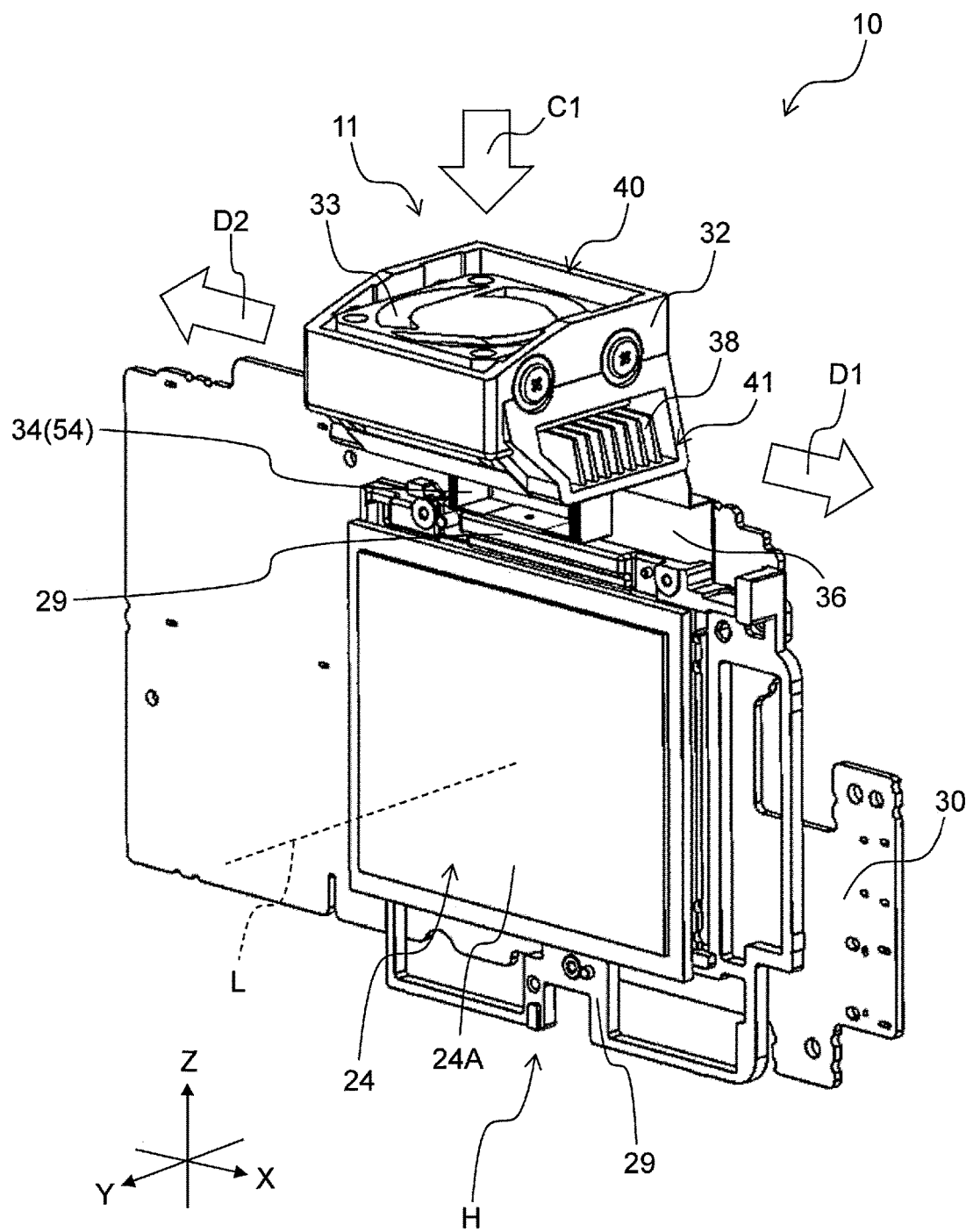
FIG. 6 is a perspective view illustrating the heat source and the heat dissipation mechanism according to the first embodiment.

FIGS. 5 and 6 are respectively a side view and a perspective view illustrating the heat source H and the heat dissipation mechanism 10.

As illustrated in FIG. 5, the heat source H includes an image sensor 24 and an image engine 26.

The image sensor 24 is an element that captures a subject image incident through a lens and generates image data (that is, RAW data). The image sensor 24 is, for example, a CMOS image sensor. The image sensor 24 has a plate-like shape and has a main surface 24A. The optical axis L extends perpendicular to the main surface 24A, and extends in the front-rear direction (that is, Y-axis direction) that is a thickness direction of the imaging device 2. The image sensor 24 is located in front of the image engine 26.

The image engine 26 is a member for generating and outputting data processed by performing various processing on the image data generated by the image sensor 24. The image engine 26 includes a processor that processes the image data, an electronic circuit, and the like. The image engine 26 has a plate-like shape similarly to the image sensor 24, and has a main surface 26A. Similarly to the main surface 24A of the image sensor 24, the main surface 26A extends in a direction (that is, an XZ plane) perpendicular to the optical axis L.

As illustrated in FIG. 5, the image sensor 24 and the image engine 26 are arranged at intervals in the front-rear direction while the main surfaces 24A and 26A face each other along the optical axis L.

The image sensor 24 is mounted on a sensor substrate 28. The sensor substrate 28 is a substrate for mounting and supporting the image sensor 24, and has a plate-like shape. The sensor substrate 28 is supported by a sensor holder 29 attached to the front case 18. The sensor substrate 28 and the sensor holder 29 are supported in a movable state inside the imaging main body 4, and are driven in the XZ plane during body image stabilization (that is, BIS) control for correcting camera shake. The sensor substrate 28 and the sensor holder 29 are supported movably in the XZ direction by a steel ball that is a member having high rigidity while being attracted by magnetic force.

The image engine 26 is mounted on a main substrate 30. The main substrate 30 is a substrate storing a program or the like for controlling operation of the imaging device 2, and attaches and supports the image engine 26. The main substrate 30 has a plate-like shape and is fixed to a main frame (not illustrated) fastened to the front case 18.

The heat dissipation mechanism 10 includes a heat sink 32, a fan 33, a first heat transfer member 34, and a second heat transfer member 36, as members for dissipating heat generated by the image sensor 24 and the image engine 26 as the heat source H.

The heat sink 32 is a member for storing and dissipating the heat of the heat source H transferred via the heat transfer members 34 and 36. The heat sink 32 has a plurality of heat dissipating fins 38. The heat dissipating fins 38 are a plurality of plate-like members arranged at intervals, and are arranged at positions facing the fan 33. A recess 40 for disposing the fan 33 is formed in a central portion of the heat sink 32.

The fan 33 is a member for dissipating heat of the heat sink 32 to the outside by applying air to an inner surface of the heat sink 32 including the heat dissipating fins 38. The fan 33 and the heat sink 32 constitute a duct 11 that performs intake and exhaust. In FIGS. 5 and 6, a part of the duct 11 is omitted, and a configuration of the duct 11 will be described with reference to FIGS. 7 to 11.

Figure 7:
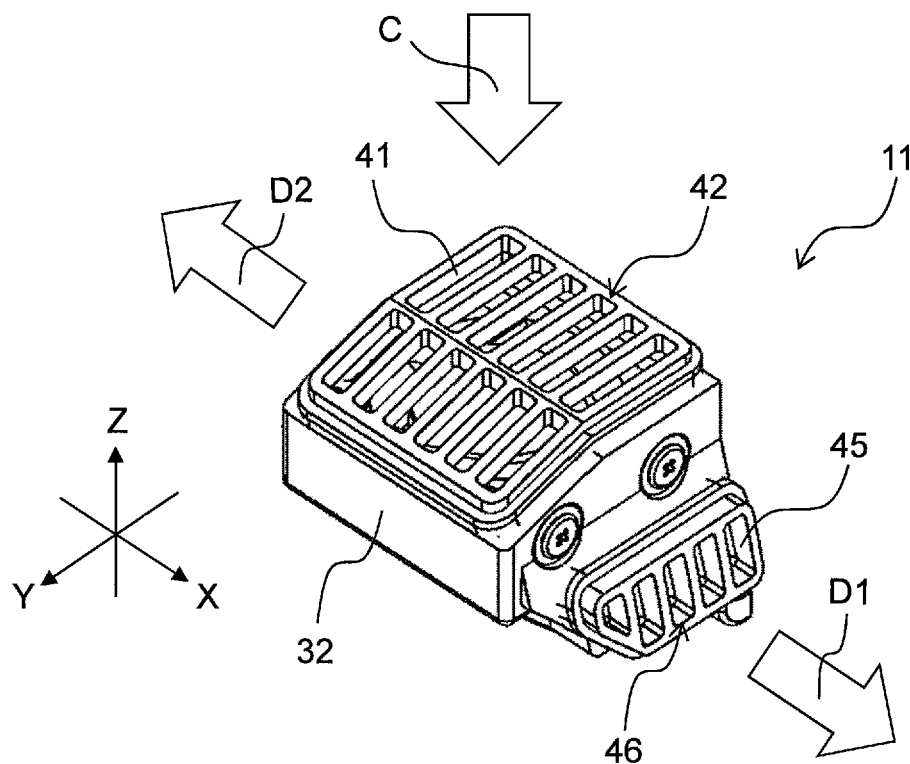
FIG. 7 is a perspective view of a duct according to the first embodiment.
Figure 8:
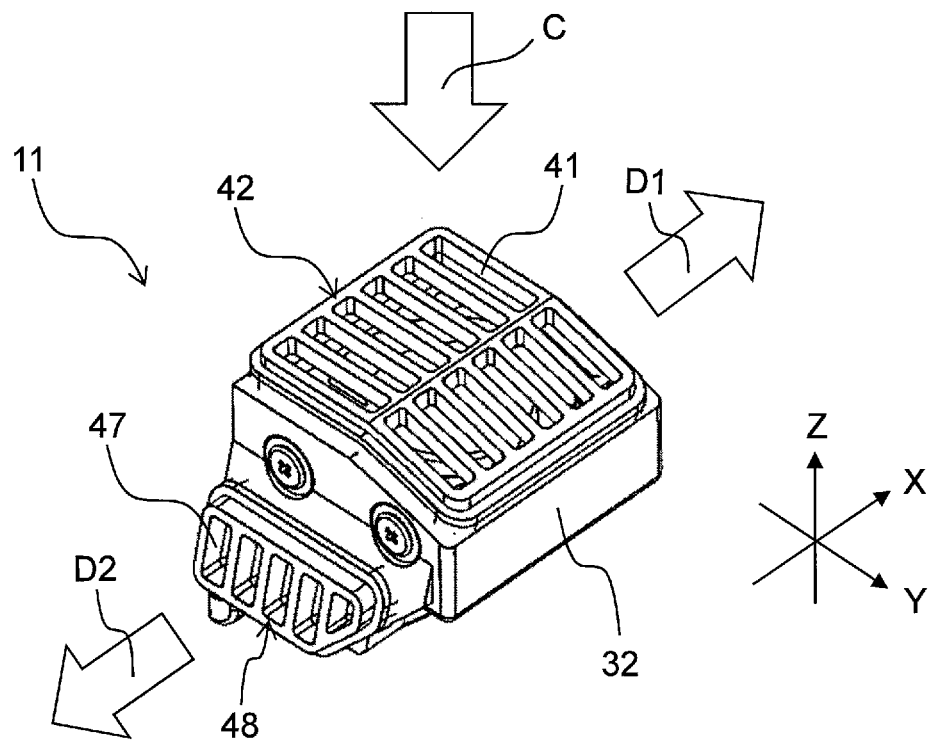
FIG. 8 is a perspective view of the duct according to the first embodiment.
Figure 9:
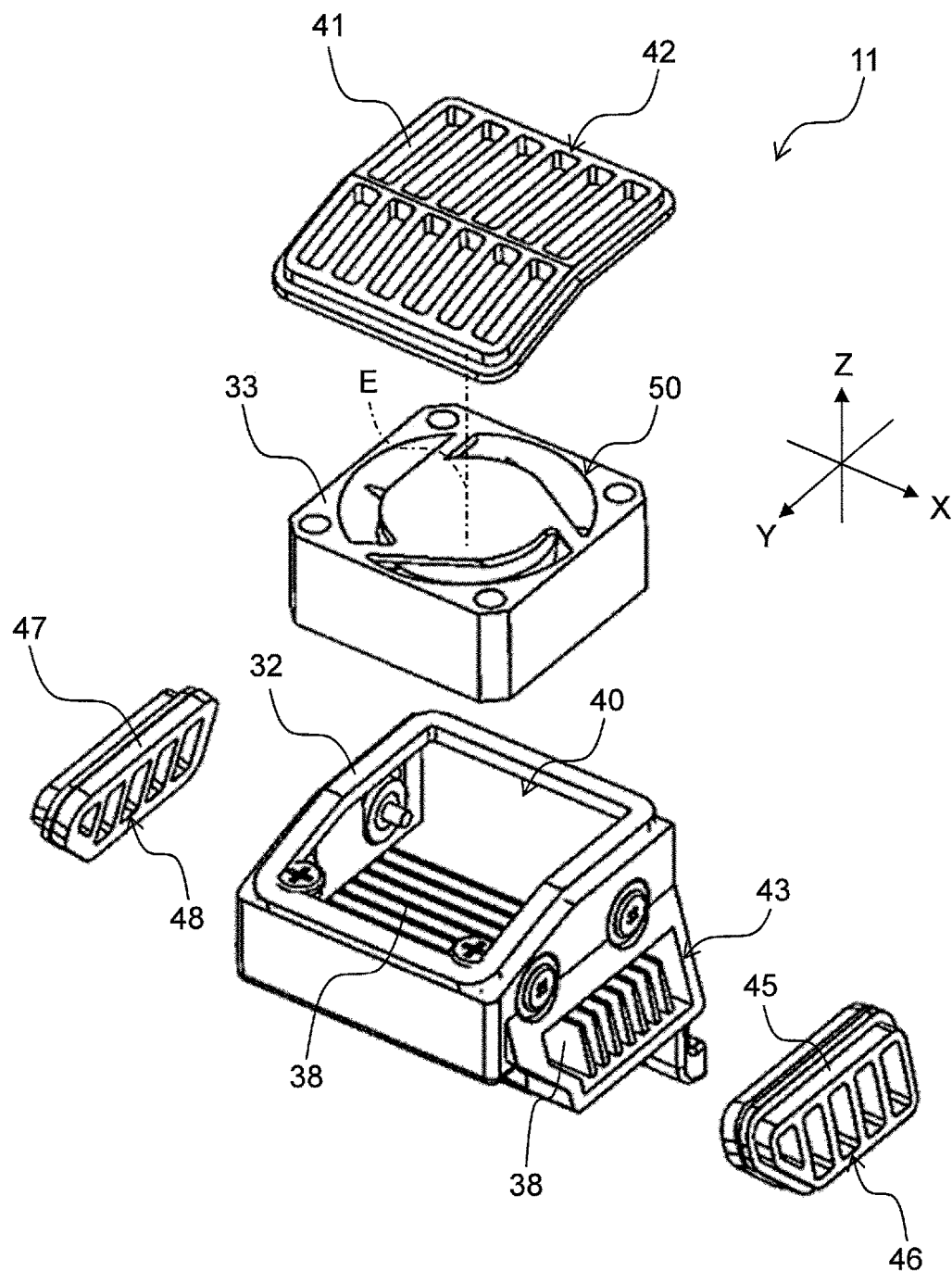
FIG. 9 is an exploded perspective view of the duct according to the first embodiment.
Figure 10:
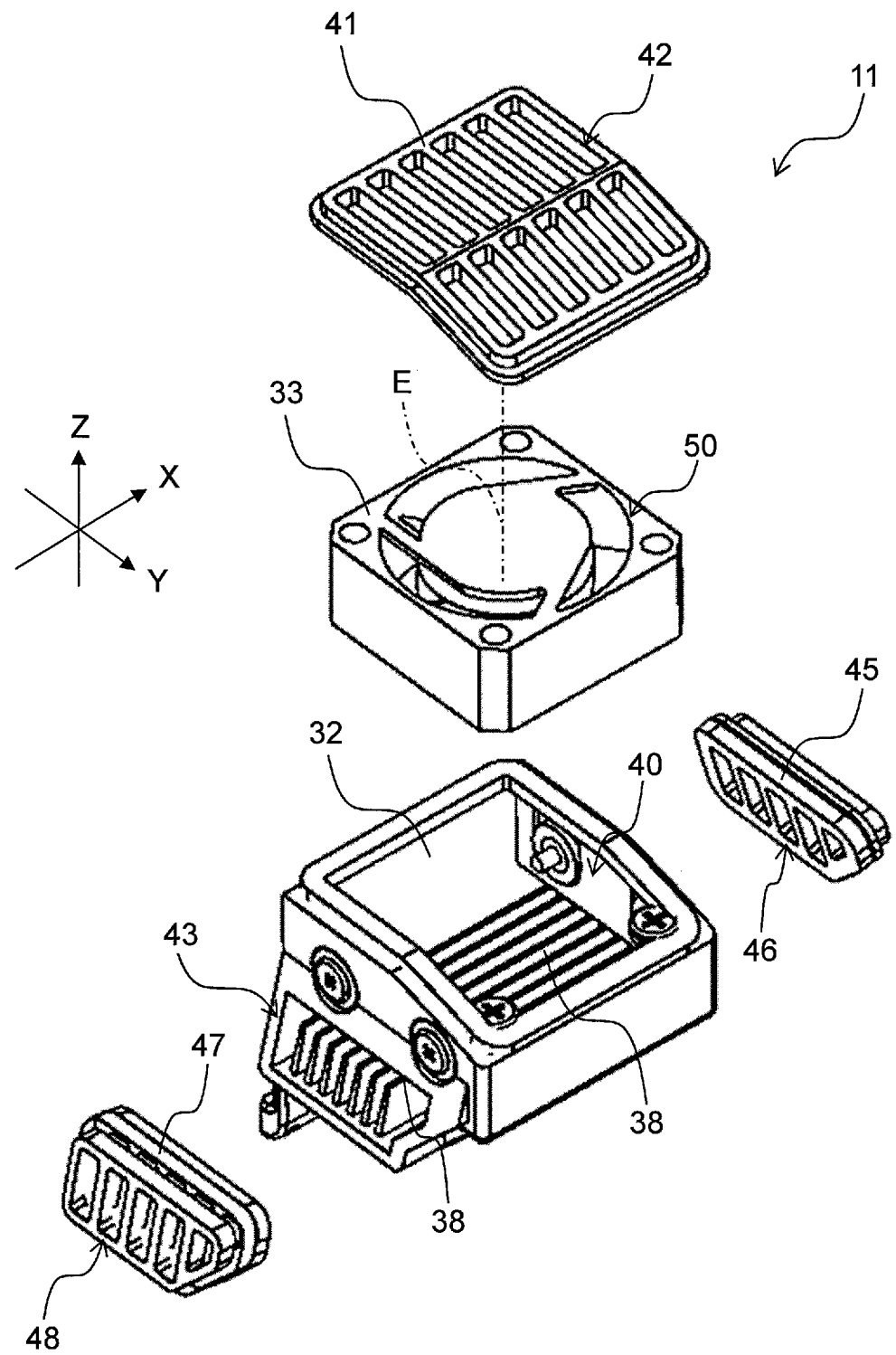
FIG. 10 is an exploded perspective view of the duct according to the first embodiment.
Figure 11:
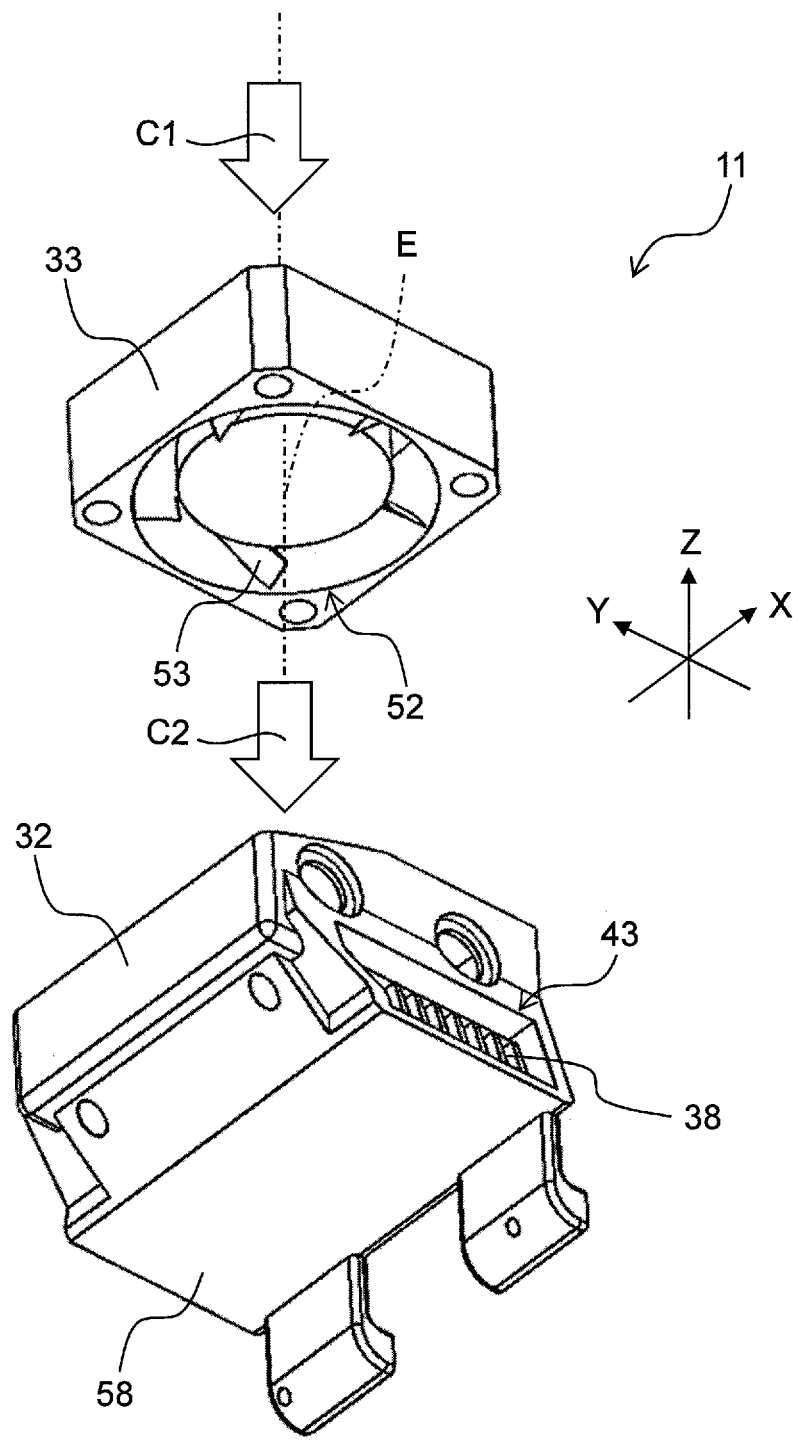
FIG. 11 is a perspective view of a heat sink and a fan according to the first embodiment as viewed from below.

FIGS. 7 and 8 are perspective views of the duct 11, FIGS. 9 and 10 are exploded perspective views of the duct 11, and FIG. 11 is a perspective view of the heat sink 32 and the fan 33 constituting the duct 11 as viewed from below.

As illustrated in FIGS. 7 and 8, the duct 11 includes an intake cover 41 and two exhaust covers 45 and 47. The intake cover 41 is a member forming an intake port 42, and the exhaust covers 45 and 47 are members respectively forming the exhaust ports 46 and 48. The intake port 42 is an opening for drawing air by driving of the fan 33, and the exhaust ports 46 and 48 are openings for discharging air. The intake port 42 and the exhaust covers 45 and 47 respectively include a plurality of openings. In the first embodiment, the intake port 42 opens upward, and the exhaust ports 46 and 48 open in the left-right direction (see FIGS. 1 and 2).

The intake cover 41 and the exhaust covers 45 and 47 are both attached to the heat sink 32. In a state where the fan 33 illustrated in FIGS. 9 and 10 is disposed in the recess 40 of the heat sink 32, the intake cover 41 is attached to an upper portion of the heat sink 32, and the exhaust covers 45 and 47 are attached to sides of the heat sink 32 so as to cover an opening 43 of the heat sink 32.

When the fan 33 is driven, the air is sucked from the intake port 42 opened upward (as shown by arrow C in FIGS. 7 and 8) and exhausted from the exhaust ports 46 and 48 opened in the left-right direction (as shown by arrows D1 and D2). In a process in which the air flows from the intake port 42 to the exhaust ports 46 and 48, the air comes into contact with the inner surface of the heat sink 32 including the heat dissipating fins 38, so that the heat of the heat source H transferred to the heat dissipating fins 38 can be dissipated to the outside of the imaging device 2.

In the first embodiment, an axial fan is used as the fan 33. As illustrated in FIGS. 9 to 11, the fan 33 as the axial fan has an intake port 50 formed on a front surface side thereof and a discharge port 52 (as shown in FIG. 11) formed on a back surface side thereof. As illustrated in FIG. 11, the fan 33 has a plurality of blades 53, and when the blades 53 rotate about a rotational axis E extending in the Z-axis direction, the air is sucked from the intake port 50 of the fan 33 (as shown by arrow C1) and blown out from the discharge port 52 (as shown by arrow C2). The fan 33 as the axial fan sucks and discharges the air in a direction along the rotational axis E (as shown by arrows C1 and C2). Note that FIGS. 9 to 11 schematically illustrate shapes of the intake port 50, the discharge port 52, and the blades 53.

When the fan 33 is disposed in the recess 40, the discharge port 52 of the fan 33 is disposed to face the heat dissipating fins 38 of the heat sink 32. The air blown out from the discharge port 52 of the fan 33 directly hits the heat dissipating fins 38. Thus, a flow of the air is generated inside the heat sink 32, the air spreads over the entire heat sink, and the heat collected to the heat dissipating fins 38 can be efficiently dissipated.

Returning to FIGS. 5 and 6, the first heat transfer member 34 is a member that transfers the heat of the image sensor 24 to the heat sink 32. The second heat transfer member 36 is a member that transfers the heat of the image engine 26 to the heat sink 32.

Both of the heat transfer members 34 and 36 extend upward from the heat source H (as shown by arrow B) and are connected to the heat sink 32. In other words, the heat transfer members 34 and 36 respectively extend in directions along the main surface 24A of the image sensor 24 and the main surface 26A of the image engine 26.

The first heat transfer member 34 is attached to an upper end portion 29A of the sensor holder 29 that supports the image sensor 24. As illustrated in FIG. 5, the first heat transfer member 34 includes a follower 54 and a sheet 56. Configurations of the follower 54 and the sheet 56 will be described with reference to FIGS. 12 to 16.

Figure 12:
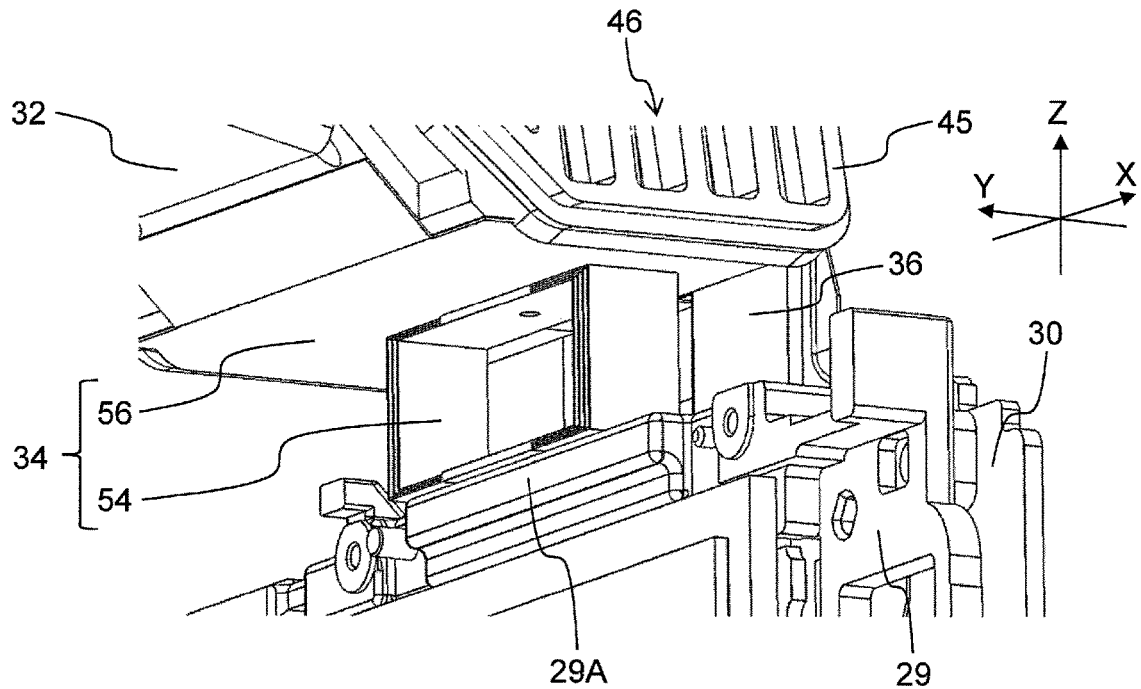
FIG. 12 is a perspective view illustrating a peripheral configuration of a first heat transfer member according to the first embodiment.
Figure 13:
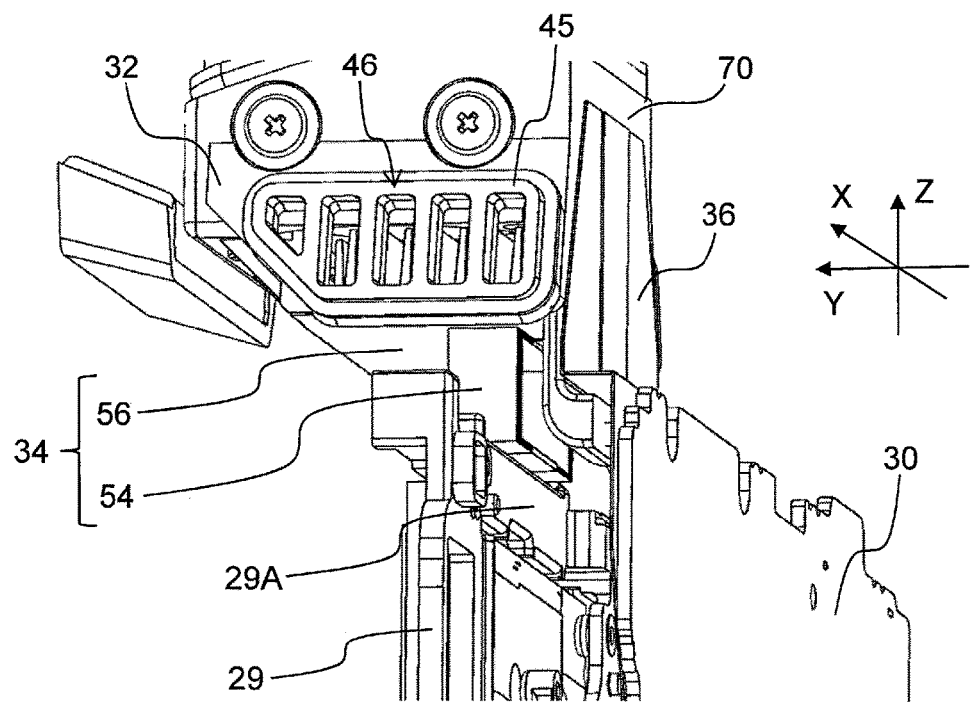
FIG. 13 is a perspective view illustrating the peripheral configuration of the first heat transfer member according to the first embodiment.
Figure 14:
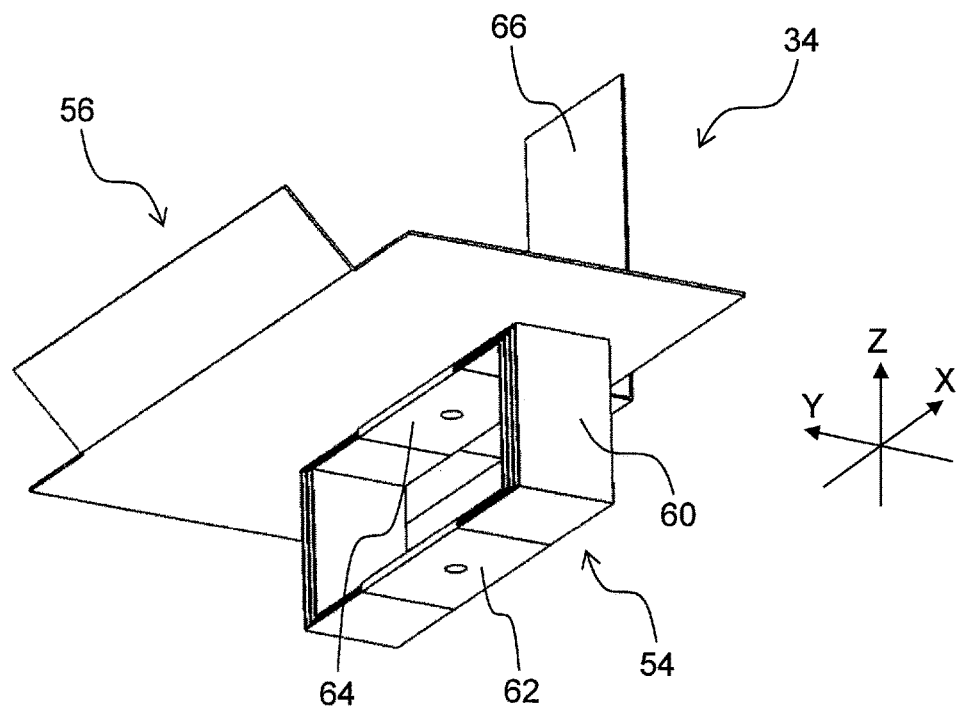
FIG. 14 is a perspective view illustrating the first heat transfer member according to the first embodiment.
Figure 15:
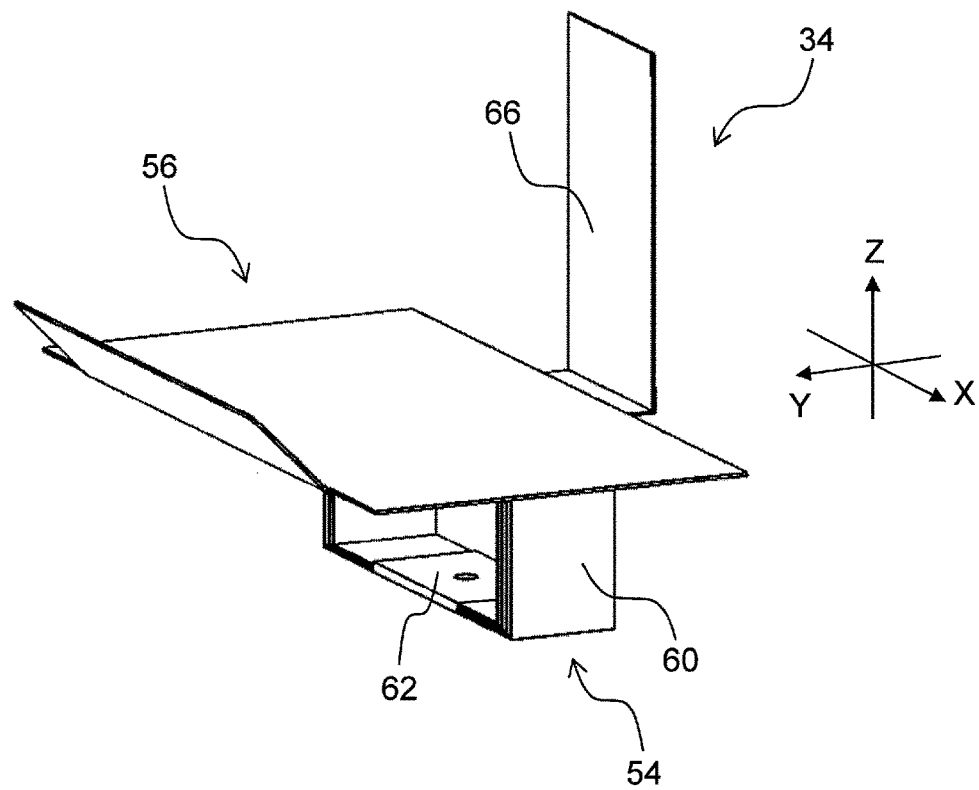
FIG. 15 is a perspective view illustrating the first heat transfer member according to the first embodiment.
Figure 16:
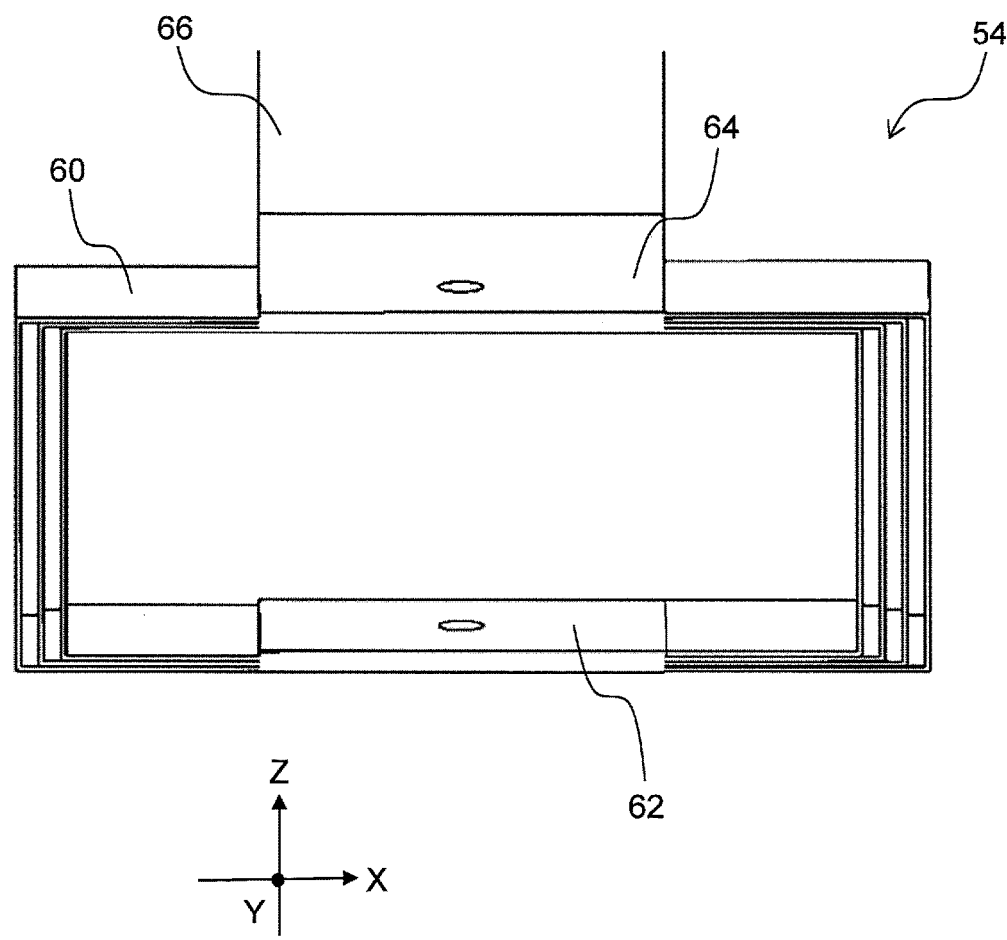
FIG. 16 is a perspective view of a follower of the first heat transfer member according to the first embodiment as viewed from a front side.

FIGS. 12 and 13 are perspective views illustrating a peripheral configuration of the first heat transfer member 34, FIGS. 14 and 15 are perspective views illustrating the first heat transfer member 34, and FIG. 16 is a perspective view of the follower 54 as viewed from the front side.

The follower 54 is a member having a shape that follows movement of the sensor substrate 28 supporting the image sensor 24, and the sensor holder 29. The follower 54 is attached to the upper end portion 29A of the sensor holder 29. The sheet 56 is connected to the follower 54 and is attached to a bottom surface 58 (FIG. 11) of the heat sink 32.

As illustrated in FIGS. 14 to 16, the follower 54 includes a concentric sheet 60, binding portions 62 and 64, and a sheet 66. The concentric sheet 60 is a portion in which sheets are concentrically arranged, and the binding portions 62 and 64 are portions each binding a part of the concentric sheet 60. A first binding portion 62 binds a lower central portion of the concentric sheet 60, and a second binding portion 64 binds an upper central portion of the concentric sheet 60. The sheet 66 is a portion connected to the second binding portion 64 and attached to a back surface 70 (as shown in FIG. 13) of the heat sink 32.

By providing the concentric sheet 60, even when the sensor substrate 28 and the sensor holder 29 are driven in the XZ plane by BIS control, the concentric sheet 60 is deformed according to movement of the sensor holder 29, so that it is possible to follow the movement of the sensor holder 29. This makes it possible to achieve both the BIS control performed by driving the sensor substrate 28 and the sensor holder 29 and heat conduction by the first heat transfer member 34.

Each member constituting the above-described first heat transfer member 34 may be formed of a material having high thermal conductivity (for example, a graphite sheet).

Figure 17:
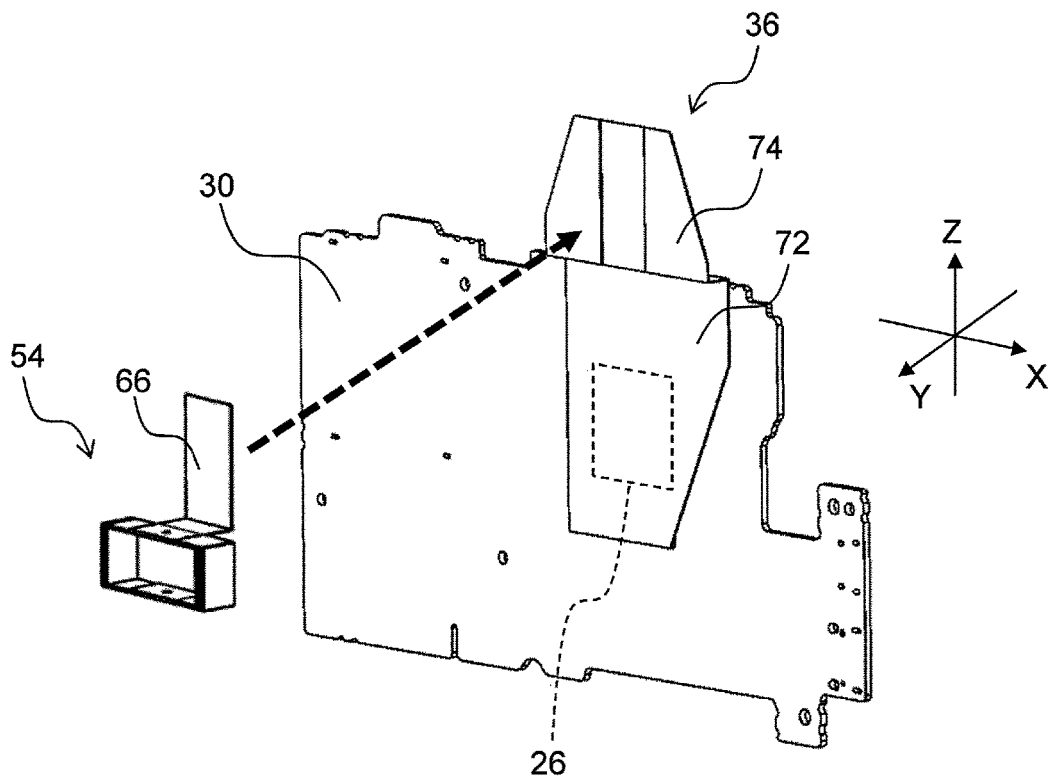
FIG. 17 is a perspective view illustrating a peripheral configuration of a second heat transfer member according to the first embodiment.
Figure 18:
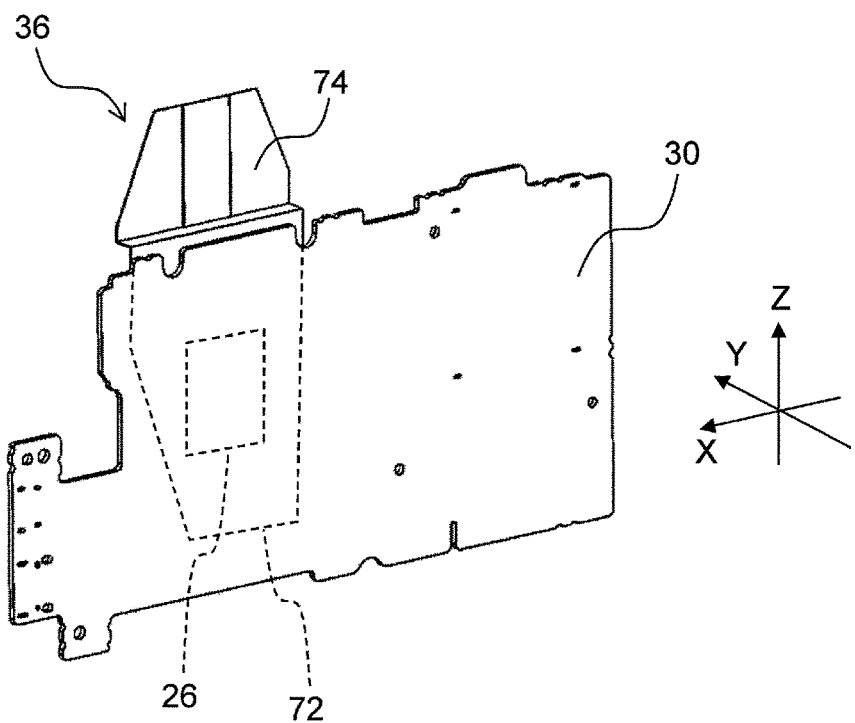
FIG. 18 is a perspective view illustrating the peripheral configuration of the second heat transfer member according to the first embodiment.

Next, the second heat transfer member 36 will be described with reference to FIGS. 17 and 18. FIGS. 17 and 18 are perspective views illustrating a peripheral configuration of the second heat transfer member 36.

The second heat transfer member 36 illustrated in FIGS. 17 and 18 is attached to a main frame (not illustrated) and is in contact with the image engine 26 mounted on the main substrate 30 via an elastic heat transfer member (that is, a thermal interface material). The second heat transfer member 36 includes a first sheet 72 and a second sheet 74.

The first sheet 72 is a portion attached to the image engine 26 via the elastic heat transfer member. The second sheet 74 is a portion that extends upward with respect to the first sheet 72 and is attached to the back surface 70 (as shown in FIG. 13) of the heat sink 32. The first sheet 72 and the second sheet 74 are integrally formed by bending one sheet.

As illustrated in FIG. 17, the second sheet 74 is attached to the back surface 70 of the heat sink 32 while being in contact with the sheet 66 of the follower 54 described above (as shown by dotted arrow), and is in contact with the heat sink 32 at a location different from the sheet 66.

Figure 19:
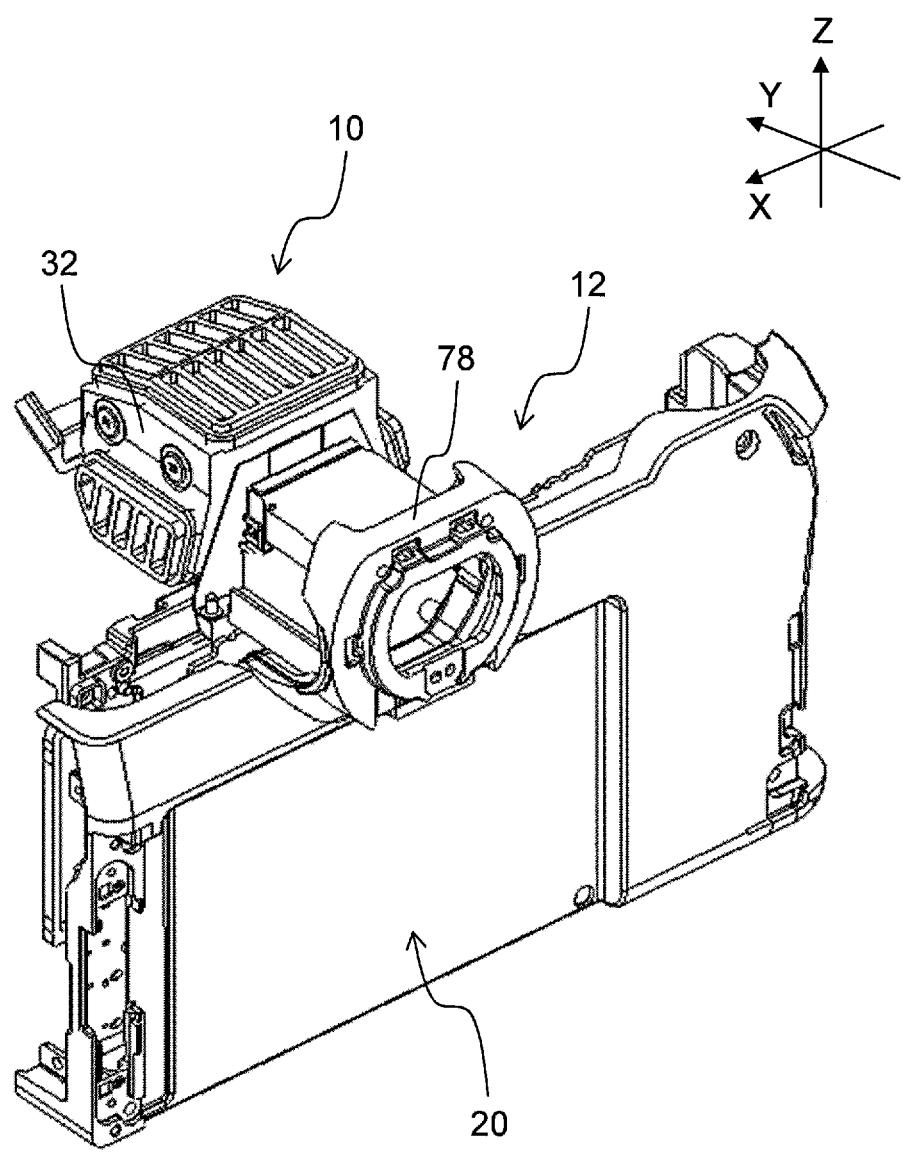
FIG. 19 is a perspective view illustrating a peripheral configuration of an EVF unit according to the first embodiment.
Figure 20:
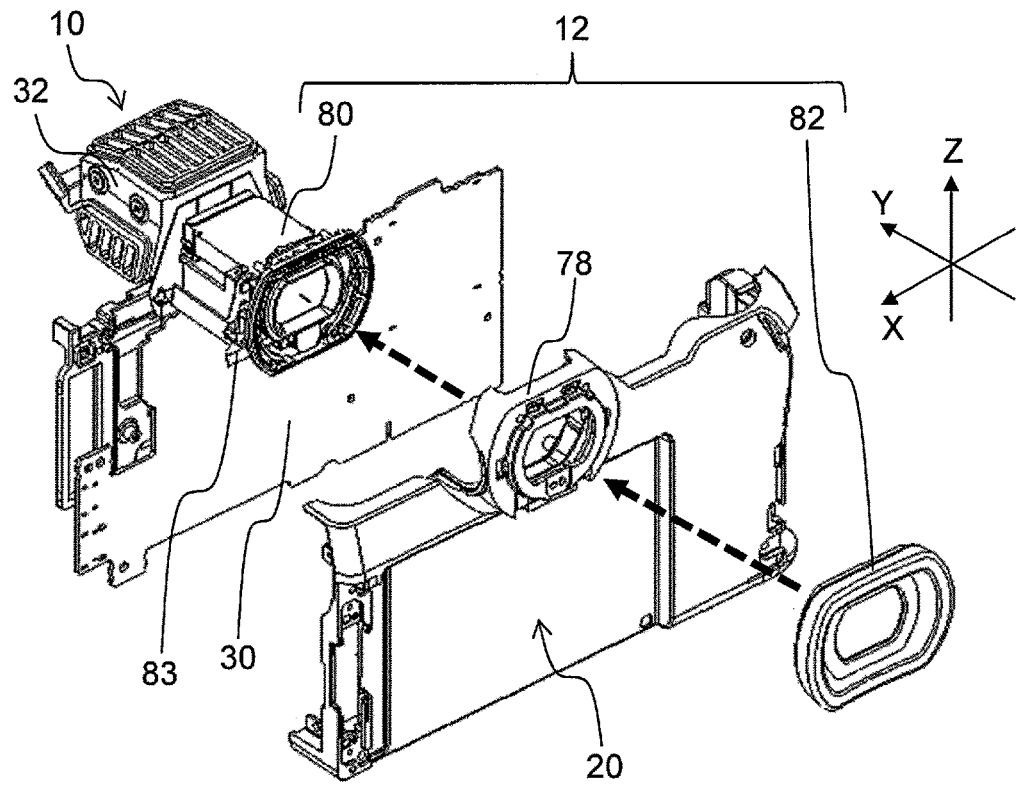
FIG. 20 is a perspective view illustrating the peripheral configuration of the EVF unit according to the first embodiment.
Figure 21:
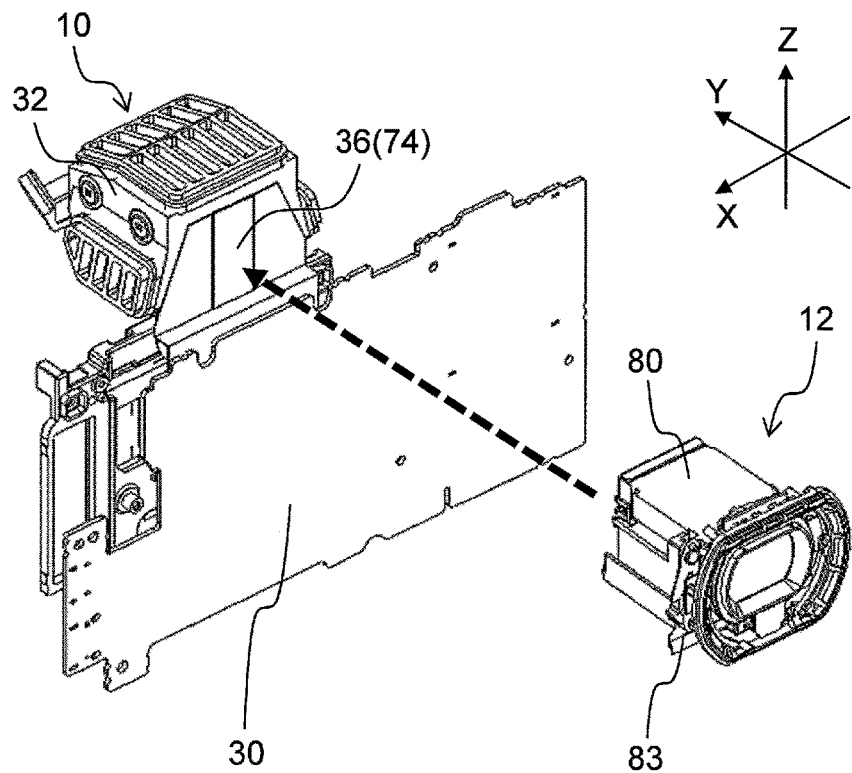
FIG. 21 is a perspective view illustrating the peripheral configuration of the EVF unit according to the first embodiment.

Next, the EVF unit 12 illustrated in FIGS. 1 to 4 will be described with reference to FIGS. 19 to 21. FIGS. 19 to 21 are perspective views illustrating a peripheral configuration of the EVF unit 12.

The EVF unit 12 illustrated in FIG. 19 is fixed to the top case 22 (as shown in FIG. 4) with screws and is disposed to sandwich an eye cup mounting portion 78 provided in the rear case 20.

As illustrated in FIG. 20, the EVF unit 12 includes a main body 80 and an eye cup 82. The main body 80 and the eye cup 82 are arranged to sandwich the eye cup mounting portion 78 of the rear case 20.

The main body 80 constitutes a main body of the EVF unit 12, and includes a heat source such as a liquid crystal panel or an IC, and a substrate connection portion 83. The substrate connection portion 83 is a portion for connecting the EVF unit 12 to the main substrate 30, and an operation of the EVF unit 12 is controlled by the main substrate 30. The eye cup 82 is a portion to which the user puts one's eyes when viewing a screen of the EVF unit 12.

As illustrated in FIG. 21, the main body 80 of the EVF unit 12 is disposed close to a back surface of the sheet 74 of the second heat transfer member 36 described above. Thus, when heat generation of the EVF unit 12 is large, the heat can be transferred from the EVF unit 12 to the sheet 74 via the elastic heat transfer member, and can be dissipated to the heat sink 32 via the second heat transfer member 36.

Figure 22:
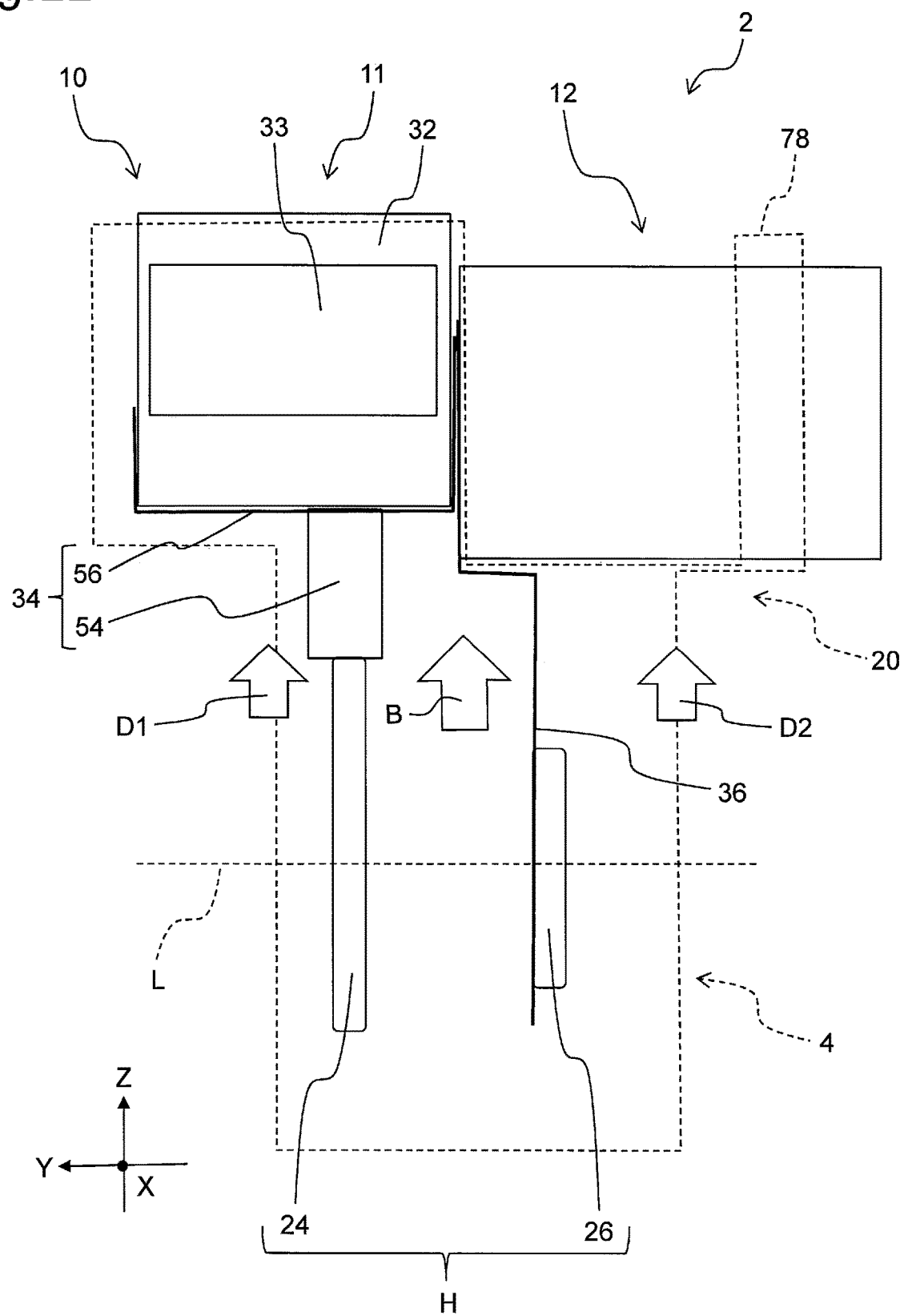
FIG. 22 is a side view schematically illustrating a layout of the imaging device according to the first embodiment.

A layout including the heat source H and the heat dissipation mechanism 10 in the imaging device 2 having the above-described configuration will be described with reference to FIGS. 22 and 23. FIGS. 22 and 23 are a side view and a perspective view schematically illustrating the layout including the heat source H and the heat dissipation mechanism 10.

As illustrated in FIG. 22, the heat transfer members 34 and 36 extend upward from the heat source H and are connected to the heat sink 32, and the heat sink 32 is located on an outer peripheral side of the imaging main body 4 with respect to the heat source H (as shown by arrow B). According to such an arrangement, when the heat sink 32 and the fan 33 are provided as the heat dissipation mechanism 10, it is possible to effectively utilize a space of the imaging device 2 to arrange the heat sink 32 and the fan 33 and to suppress a thickness of the imaging device 2 particularly in the front-rear direction to be small. Thus, it is possible to achieve both securing of heat dissipation and making the imaging device 2 compact, and it is easy to achieve both the heat dissipation and designability.

As illustrated in FIG. 23, the heat sink 32 and the fan 33 are arranged in an outer peripheral portion and the central upper portion (in particular, directly above the optical axis L) of the imaging main body 4. By disposing the heat sink 32 and the fan 33 at a location such as a "penta portion (that is, location incorporating a pentaprism)" in a conventional film type camera, the heat sink 32 and the fan 33 can be newly arranged without significantly changing a form of a conventional model digital camera. This makes it possible to realize a digital camera that easily achieves both the heat dissipation and the designability. Note that the "central upper portion" is a position facing upward (along +Z direction) in a region excluding both ends in a lateral width (along an X direction) of the imaging main body 4.

Further, the heat sink 32 and the fan 33 are provided in a front region of the EVF unit 12. This makes it possible to newly arrange the heat sink 32 and the fan 33 without significantly changing a form of a conventional model imaging device having the EVF unit 12.

As illustrated in FIG. 22, the duct 11 (that is, the heat sink 32 and the fan 33) is disposed directly above the image sensor 24, and the EVF unit 12 is disposed directly above the image engine 26. Thus, the duct 11 and the EVF unit 12 can be arranged while effectively utilizing the space of the imaging device 2.

As illustrated in FIGS. 1 and 20, the heat dissipation mechanism 10 overlaps the EVF unit 12 in size when viewed from a front of the camera in the Y-axis direction. As illustrated in FIG. 23, the duct 11 and the EVF unit 12 are both arranged directly above the optical axis L (as shown by arrows D1 and D2). Thus, the overall form of the imaging device 2 can be formed in a well-balanced manner, and designability can be improved.

Further, a gyro sensor 84 for detecting camera shake is housed inside the grip 6. As compared with a configuration in which the gyro sensor is housed in the central upper portion (that is, penta portion in the conventional film type camera) of the imaging main body 4 as in the conventional imaging device, a margin space in the imaging main body 4 increases, so that it is possible to suppress an increase in size of the imaging device 2 such as newly providing the duct 11 in the upper portion of the imaging main body 4.

According to the above configuration, even when the heat source H such as the image sensor 24 and the image engine 26 generates a large amount of heat, the heat is efficiently dissipated by the heat dissipation mechanism 10 including the heat sink 32 and the fan 33, so that it is possible to suppress stop of the operation of the imaging device 2 due to overheating. In recent years, the trend of higher image quality and higher performance and the use of moving images have become mainstream, and when a problem of stopping a camera function due to overheating is becoming serious, the imaging device 2 can be an effective solution to such a heat problem and can give the user a sense of security. On the other hand, by disposing the duct 11 including heat sink 32 and the fan 33 in the central upper portion of the imaging main body 4 corresponding to an empty space such as the front region of the EVF unit 12, the increase in size of the imaging device 2 is suppressed, and both the heat dissipation and the designability are easily achieved.

As described above, the imaging device 2 of the first embodiment includes the heat source H, the heat dissipation mechanism 10 for dissipating the heat of the heat source H, the imaging main body 4 to which the heat source H and the heat dissipation mechanism 10 are attached, and the grip 6 provided on the side of the imaging main body 4, and the heat dissipation mechanism 10 (particularly, the heat sink 32 and the fan 33) is disposed on the outer peripheral portion of the imaging main body 4.

According to such a configuration, it is possible to dispose the heat dissipation mechanism 10 while effectively utilizing the space of the imaging device 2, and it is easy to achieve both the heat dissipation and the designability. Note that when the heat dissipation mechanism 10 is disposed on the outer peripheral portion of the imaging main body 4, at least the intake port 42 and the exhaust port 46 are arranged to be exposed to an outer periphery of the imaging main body 4, and the heat sink 32 and the fan 33 are arranged in the vicinity thereof.

Further, in imaging device 2 of the first embodiment, the heat dissipation mechanism 10 is disposed at the central upper portion of the imaging main body 4. Thus, the heat dissipation mechanism 10 can be disposed without significantly changing the form of the conventional model imaging device, and it is easy to achieve both the heat dissipation and the designability.

Further, the imaging device 2 of the first embodiment further includes the EVF unit 12, and the heat dissipation mechanism 10 is disposed in front of the EVF unit 12. Thus, the heat dissipation mechanism 10 can be disposed without significantly changing the form of the conventional model imaging device having the EVF unit, and it is easy to achieve both the heat dissipation and the designability.

Further, in the imaging device 2 of the first embodiment, the heat dissipation mechanism 10 is disposed directly above the optical axis L. Thus, the form of the entire imaging device 2 can be formed in a well-balanced manner.

In addition, in the imaging device 2 of the first embodiment, the heat dissipation mechanism 10 includes the heat sink 32, the fan 33, and the heat transfer members 34 and 36 that transfer the heat of the heat source H to the heat sink 32, and the heat source H has the main surfaces 24A and 26A extending in a direction intersecting the optical axis L, the heat transfer members 34 and 36 extend in a direction along the main surfaces 24A and 26A from the heat source H and are connected to the heat sink 32, and the heat sink 32 and the fan 33 are arranged on the outer peripheral portion of the imaging main body 4. Thus, by disposing the heat sink 32 and the fan 33 having a relatively large volume in the empty space of the imaging main body 4, it is easy to secure the heat dissipation without impairing the design of the imaging device 2.

Further, in the imaging device 2 of the first embodiment, the heat source H includes the image sensor 24 (that is, first heat source) and the image engine 26 (that is, second heat source), and the heat transfer members 34 and 36 include the first heat transfer member 34 that transfers the heat of the image sensor 24 to the heat sink 32 and the second heat transfer member 36 that transfers the heat of the image engine 26 to the heat sink 32.

According to such a configuration, a plurality of heat sources H can be connected to the heat sink 32 to dissipate the heat.

In addition, the imaging device 2 of the first embodiment further includes the sensor substrate 28 that supports the image sensor 24, and the first heat transfer member 34 includes the follower 54 that follows the movement of the sensor substrate 28 driven by the BIS control, and the sheet 56 attached to the heat sink 32.

According to such a configuration, even when the sensor substrate 28 supporting the image sensor 24 is driven by the BIS control, the follower 54 of the first heat transfer member 34 follows the movement of the sensor substrate 28, so that both the BIS control for driving the sensor substrate 28 and heat transfer by the first heat transfer member 34 can be achieved.

In addition, the imaging device 2 of the first embodiment further includes the duct 11 that connects the intake port 42 and the exhaust ports 46 and 48 for the fan 33 and passes through the heat sink 32 and the imaging main body 4 includes the duct 11 therein.

According to such a configuration, by including the duct 11 in the imaging main body 4, the imaging device 2 can be made compact.

Further, in the imaging device 2 of the first embodiment, the heat sink 32 includes the heat dissipating fins 38, and the heat dissipating fins 38 are arranged at a position facing the discharge port 52 of the fan 33.

According to such a configuration, the air blown out from the fan 33 can directly hit the heat dissipating fins 38, and the heat dissipation efficiency can be improved.

Further, in the imaging device 2 of the first embodiment, the fan 33 is the axial fan.

According to such a configuration, when the fan 33 is mounted in an appearance as in the first embodiment, since the axial fan can be provided with the heat dissipating fins 38 in a larger area than a centrifugal fan, the imaging device 2 can be made compact and the heat dissipation efficiency can be improved.

Further, in the imaging device 2 of the first embodiment, the rotational axis E of the fan 33 extends in the direction intersecting the optical axis L (the Z-axis direction in the first embodiment).

Further, the imaging device 2 according to the first embodiment further includes the gyro sensor 84 that detects the camera shake and the grip 6 that includes the gyro sensor 84 therein.

According to such a configuration, by providing the gyro sensor 84 on the grip 6, the margin space is generated in the upper portion of the imaging main body 4 in which the gyro sensor is conventionally disposed, and the imaging device 2 can be made compact, for example, by disposing the duct 11 including the heat sink 32 and the fan 33 on the upper portion of the imaging main body 4.

In addition, the imaging device 2 of the first embodiment includes the heat source H having the main surfaces 24A and 26A extending in the direction intersecting the optical axis L (that is, an optical axis direction), the heat dissipation mechanism 10 for dissipating the heat of the heat source H, and the imaging main body 4 (that is, the main body) to which the heat source H and heat dissipation mechanism 10 are attached, in which the heat dissipation mechanism 10 includes the heat sink 32, the fan 33, and the heat transfer members 34 and 36 that transfer the heat of the heat source H to the heat sink 32, the heat transfer members 34 and 36 extend in the direction along the main surfaces 24A and 26A from the heat source H and are connected to the heat sink 32, and the heat sink 32 is disposed on the outer peripheral side of the imaging main body 4 with respect to the heat source H.

According to such a configuration, while the heat dissipation is secured by the heat dissipation mechanism 10 including the heat sink 32 and the fan 33, the thickness of the imaging main body 4 in the front-rear direction is suppressed to be small, so that the imaging device 2 can be made compact. This makes it possible to realize the imaging device 2 that easily achieves both the heat dissipation and the designability.

Modification of First Embodiment

In the first embodiment, as illustrated in FIGS. 1 and 2, a case where the intake port 42 opens upward and the exhaust ports 46 and 48 open in the left-right direction has been described, but the present disclosure is not limited to such a case. The positions of the intake port and the exhaust port and the direction of intake and exhaust may be appropriately changed, and such a modification will be described with reference to FIGS. 24 to 30.

Figure 24:
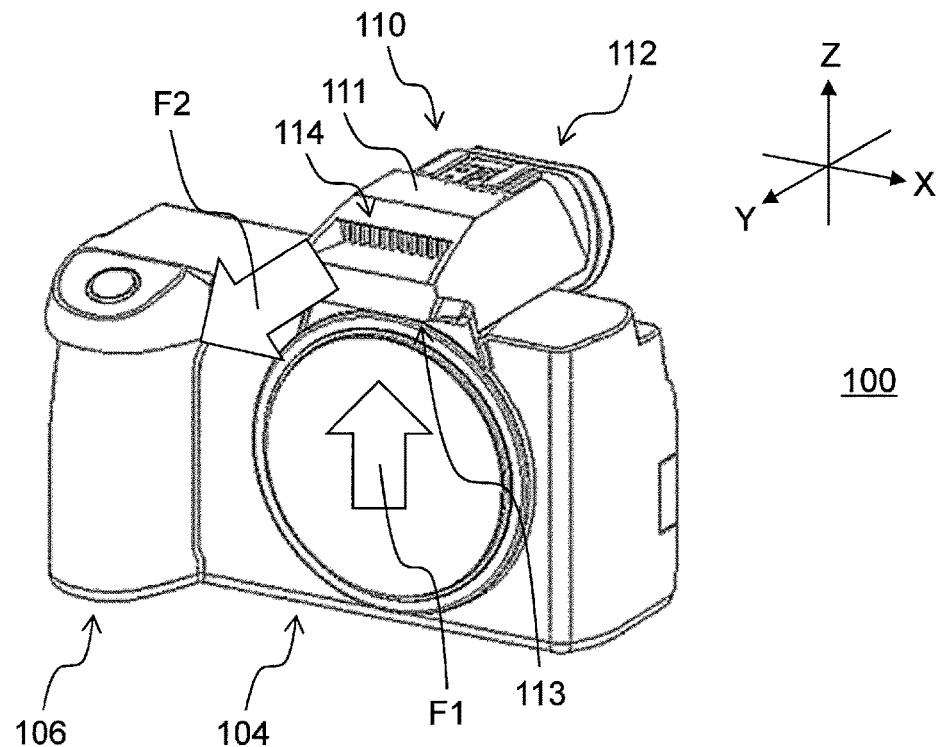
FIG. 24 is a perspective view illustrating the imaging device according to a first modification of the first embodiment.
Figure 25:
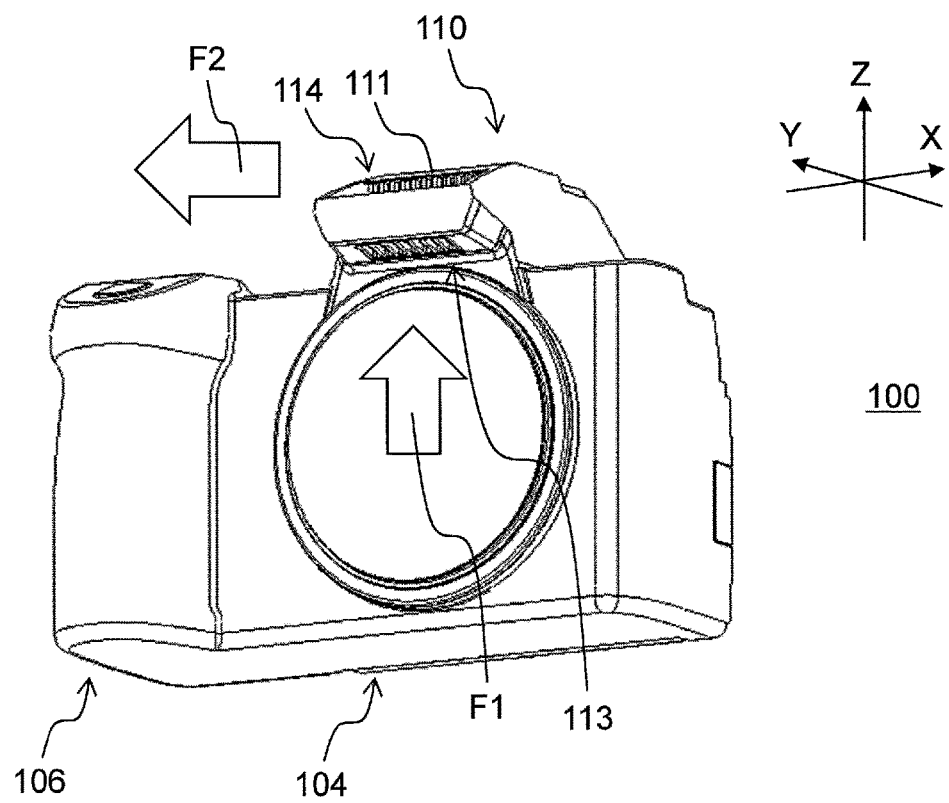
FIG. 25 is a perspective view illustrating the imaging device according to the first modification of the first embodiment.

FIGS. 24 and 25 illustrate an imaging device 100 according to a first modification. The imaging device 100 illustrated in FIGS. 24 and 25 includes an imaging main body 104, a grip 106, a heat dissipation mechanism 110, and an EVF unit 112, and a duct 111 included in the heat dissipation mechanism 110 forms an intake port 113 and an exhaust port 114.

In the examples illustrated in FIGS. 24 and 25, the intake port 113 is disposed below the exhaust port 114, the intake port 113 opens downward, and the exhaust port 114 opens forward. The intake port 113 draws air upward from below (as shown by arrow F1), and the exhaust port 114 exhausts air forward (as shown by arrow F2). Even with such a configuration, by arranging the heat sink 32, the fan 33, the heat transfer members 34 and 36, and the like with respect to the heat source H in the same manner as in the first embodiment, the same effects can be obtained.

Figure 26:
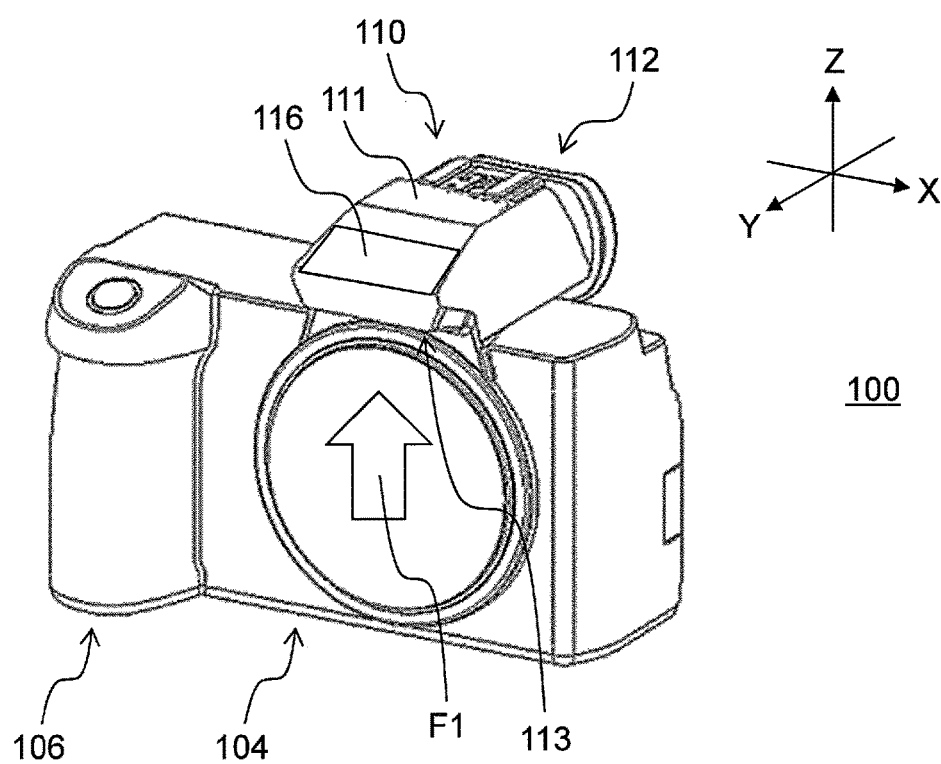
FIG. 26 is a perspective view illustrating the imaging device according to the first modification of the first embodiment.

Note that the intake port 113 and the exhaust port 114 are not limited to being always open, and a lid that can be opened and closed by a user may be provided. For example, in the example illustrated in FIG. 26, a lid 116 for opening and closing the exhaust port 114 is provided. FIG. 26 illustrates a state in which the lid 116 closes the exhaust port 114, and when the user opens the lid 116, the exhaust port 114 is exposed as illustrated in FIGS. 23 and 24. By providing such a lid 116, the lid 116 is opened to secure the heat dissipation at the time of capturing a moving image or the like, and the lid 116 is closed to prevent the exhaust port 114 from being exposed to the outside at the time of capturing a still image or the like or at the time of non-use, so that designability can be improved. In the example illustrated in FIG. 26, since the intake port 113 opens downward and is located in a place that is difficult to see from the outside, a lid may not be provided.

Figure 27:
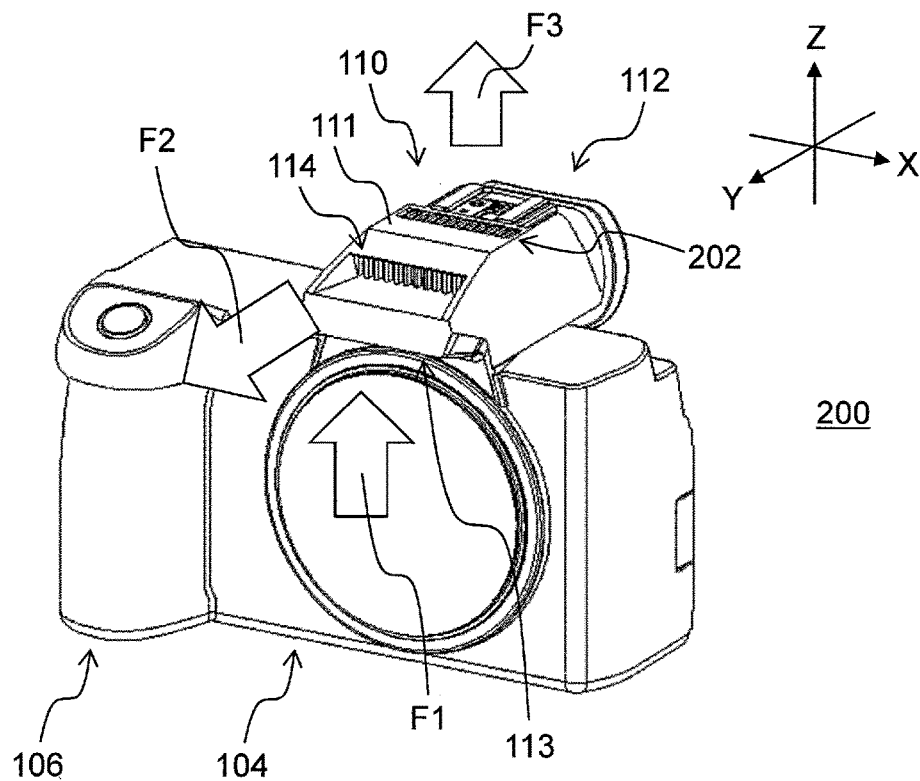
FIG. 27 is a perspective view illustrating the imaging device according to a second modification of the first embodiment.
Figure 28:
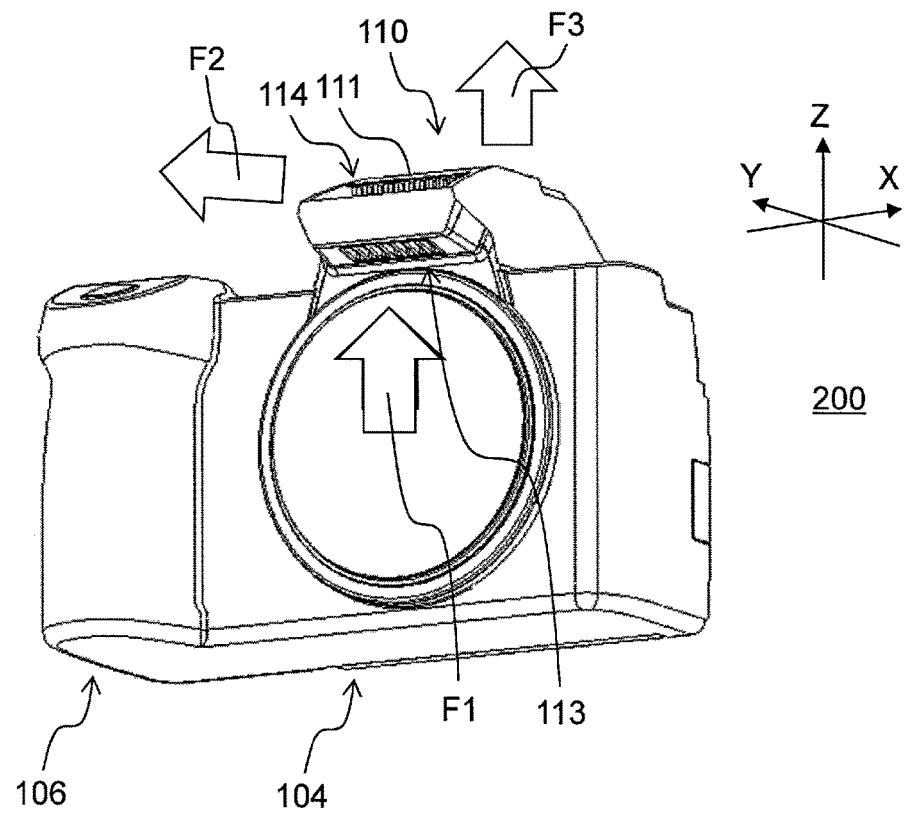
FIG. 28 is a perspective view illustrating the imaging device according to the second modification of the first embodiment.

FIGS. 27 and 28 illustrate an imaging device 200 according to a second modification. The imaging device 200 illustrated in FIGS. 27 and 28 further includes an exhaust port 202 (as shown in FIG. 27) different from the exhaust port 114 in addition to the same configuration as the imaging device 100 according to the first modification.

In the example illustrated in FIGS. 27 and 28, the exhaust port 202 opens upward and exhausts air upward (as shown by arrow F3). According to such a configuration, by providing the two types of exhaust ports 114 and 202, exhaust paths can be distributed (as shown by arrows F2 and F3), and the heat dissipation efficiency can be improved.

Figure 29:
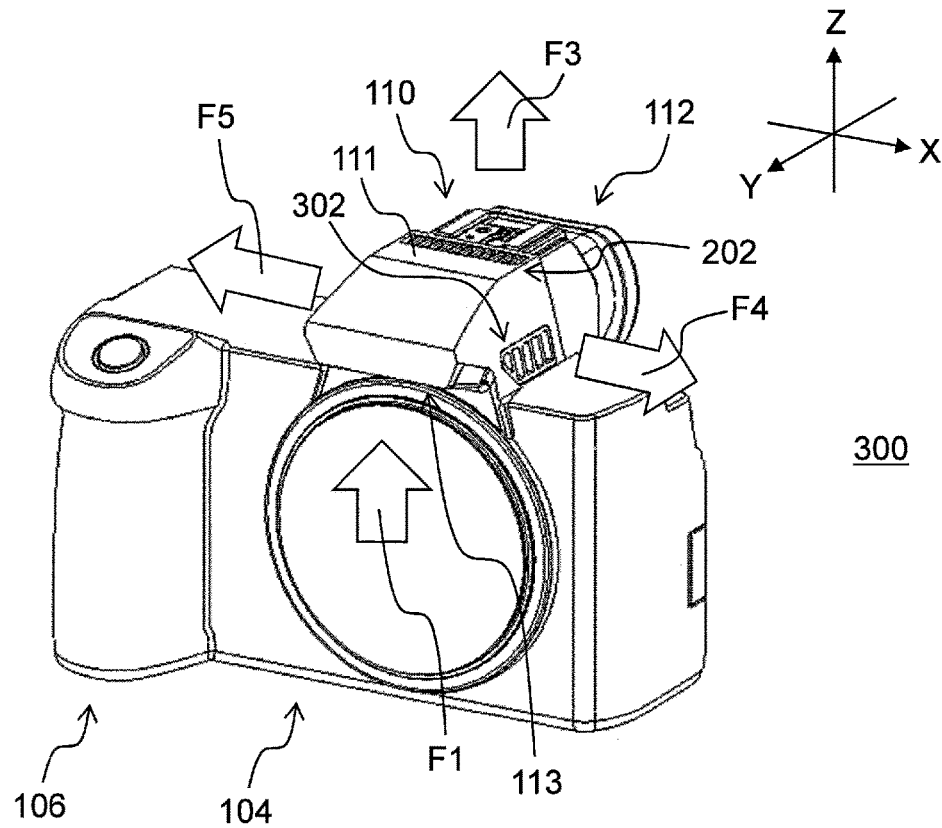
FIG. 29 is a perspective view illustrating the imaging device according to a third modification of the first embodiment.
Figure 30:
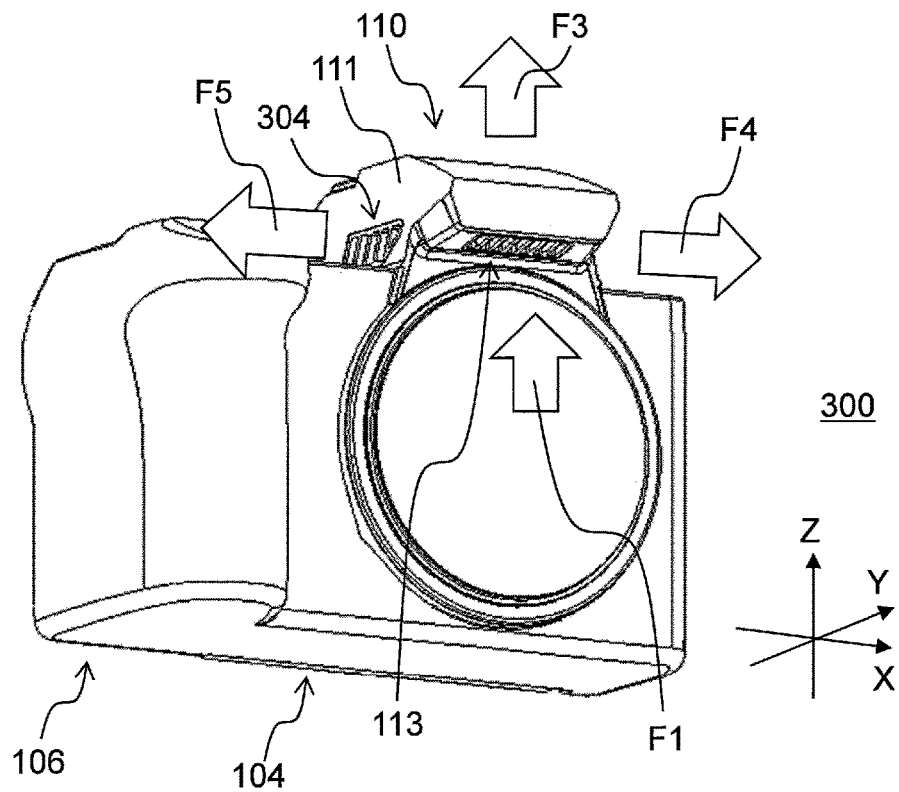
FIG. 30 is a perspective view illustrating the imaging device according to the third modification of the first embodiment.

FIGS. 29 and 30 illustrate an imaging device 300 according to a third modification. Unlike the imaging devices 100 and 200 according to the first and second modifications, the imaging device 300 illustrated in FIGS. 29 and 30 forms exhaust ports 302 and 304 that exhaust air in the left-right direction instead of the exhaust port 114 that exhausts air forward.

In the example illustrated in FIGS. 29 and 30, the exhaust port 302 opens to the left and exhausts air in the left direction (as shown by arrow F4), and the exhaust port 304 opens to the right and exhausts air in the right direction (as shown by arrow F5). According to such a configuration, by providing the three types of exhaust ports 202, 304, and 306, exhaust paths can be distributed (as shown by arrows F3, F4, and F5), and the heat dissipation efficiency can be improved.

Figure 31:
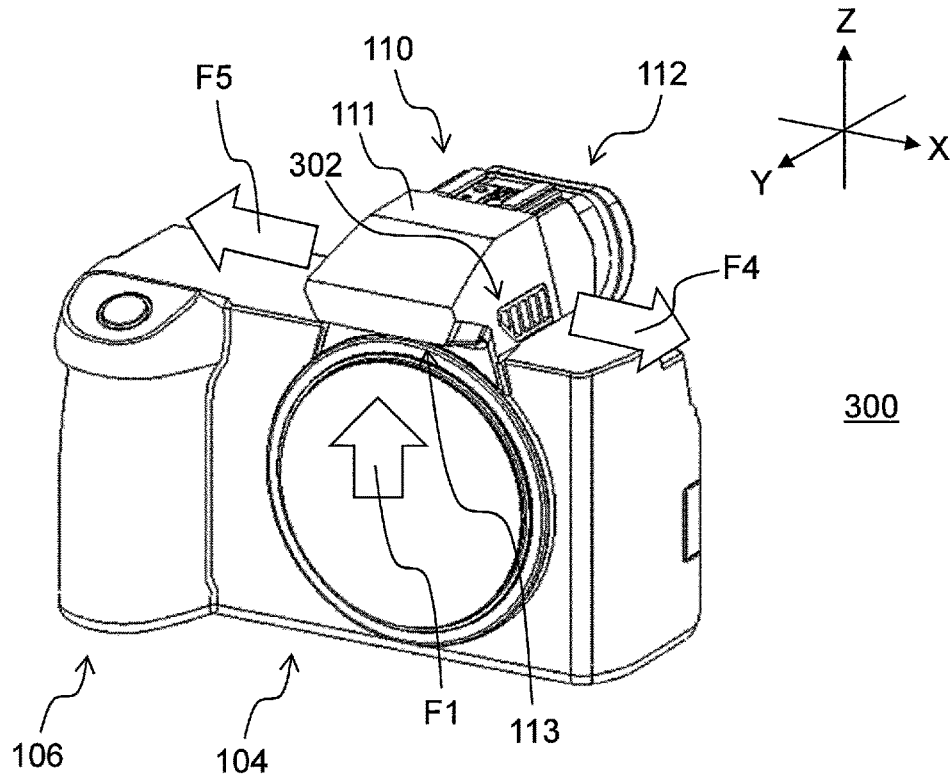
FIG. 31 is a perspective view illustrating the imaging device according to a fourth modification of the first embodiment.
Figure 32:
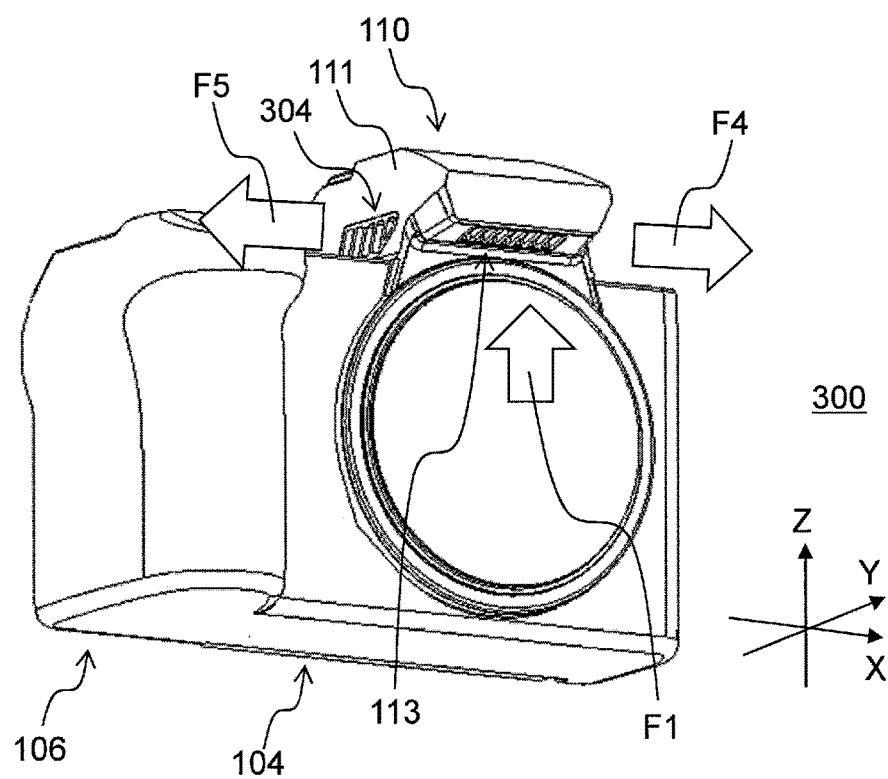
FIG. 32 is a perspective view illustrating the imaging device according to the fourth modification of the first embodiment.

Note that the exhaust port 202 illustrated in FIG. 29 may be omitted. Specifically, as in an imaging device 400 according to a fourth modification illustrated in FIGS. 31 and 32, it may be the case that only the exhaust ports 302 and 304 are provided to distribute the exhaust paths in both left and right directions (as shown by arrows F4 and F5).

In the first to fourth modifications described above, the intake port may be changed to the exhaust port, and the exhaust port may be changed to the intake port.

Second Embodiment

An imaging device 500 according to a second embodiment of the present disclosure will be described with reference to FIGS. 33 to 35. In the second embodiment, points different from the first embodiment will be mainly described. In addition, the same or equivalent components are denoted by the same reference numerals, and description thereof will be omitted.

In the first embodiment, the duct 11 is provided at the central upper portion of the imaging main body 4, whereas the second embodiment is different from the first embodiment in that the duct is provided on the side of the imaging main body.

Figure 33:
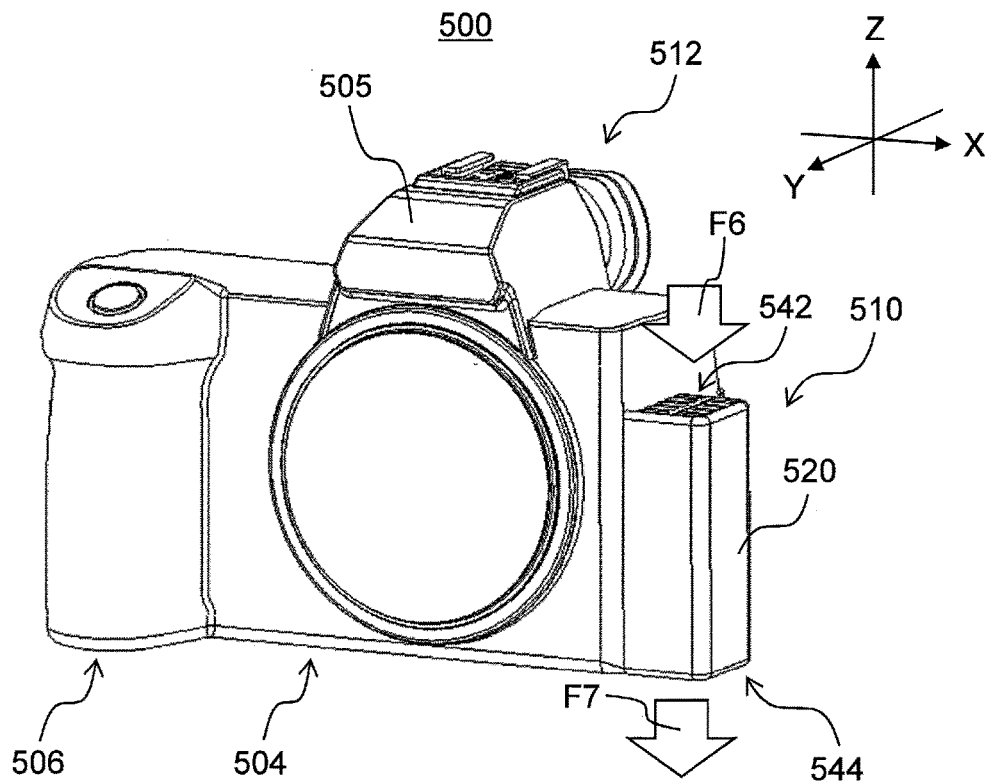
FIG. 33 is a perspective view illustrating the imaging device according to the second embodiment.
Figure 34:
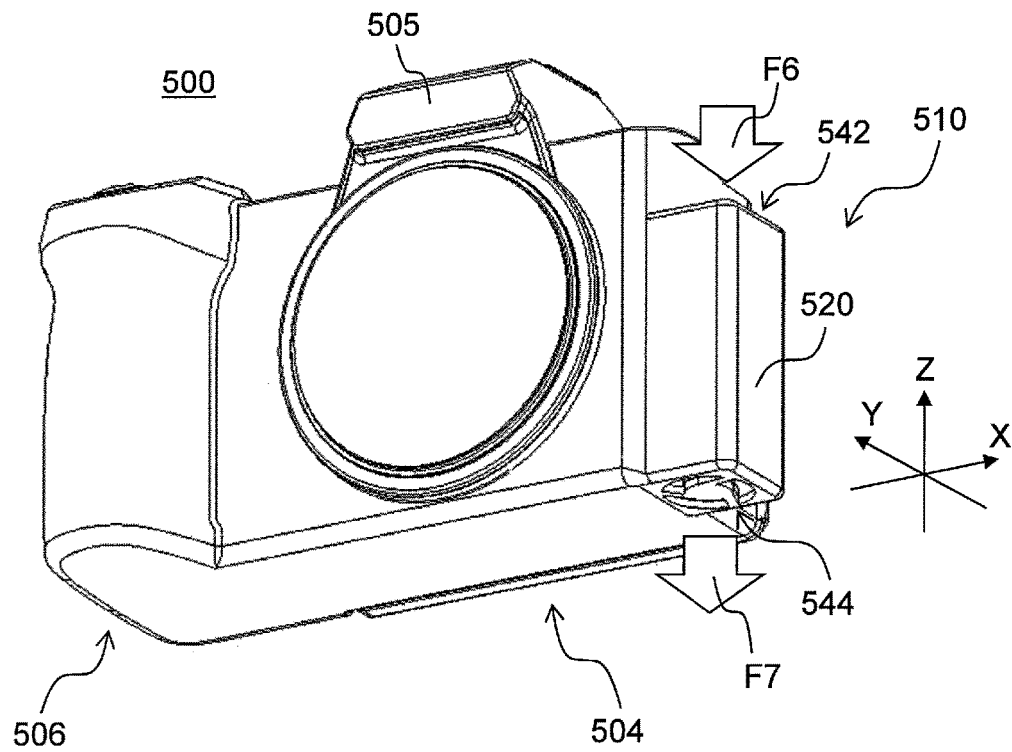
FIG. 34 is a perspective view illustrating the imaging device according to the second embodiment.

FIGS. 33 and 34 are perspective views illustrating the imaging device 500 according to the second embodiment. The imaging device 500 illustrated in FIGS. 33 and 34 includes an imaging main body 504, a grip 506, a heat dissipation mechanism 510, and an EVF unit 512. The heat dissipation mechanism 510 particularly includes a duct 520 provided on the side of the imaging main body 504.

As illustrated in FIGS. 33 and 34, the grip 506 is provided on the right side (along −X direction) of the imaging main body 504, whereas the duct 520 is provided on an opposite side to the grip 506, that is, on the left side (along +X direction) of the imaging main body 504. According to such an arrangement, the grip 506 and the heat dissipation mechanism 510 (in particular, the duct 520) are arranged at symmetrical positions with respect to the imaging main body 504, and a form when the imaging device 2 is viewed from the front can be formed in a well-balanced manner. This makes it possible to realize the imaging device 500 that easily achieves both the heat dissipation and the designability.

Note that at the central upper portion of the imaging main body 504, a penta portion 505 may be provided, or a member different from the penta portion 505 may be disposed.

The duct 520 forms an intake port 542 and an exhaust port 544. In the example illustrated in FIGS. 33 and 34, the intake port 542 opens upward to draw air downward (as shown by arrow F6), and the exhaust port 544 opens downward to exhaust air downward (as shown by arrow F7).

A configuration of the heat dissipation mechanism 510 and a layout of the imaging device 500 of the second embodiment will be described with reference to FIG. 35. FIG. 35 is a perspective view schematically illustrating the layout of the imaging device 500.

Figure 35:
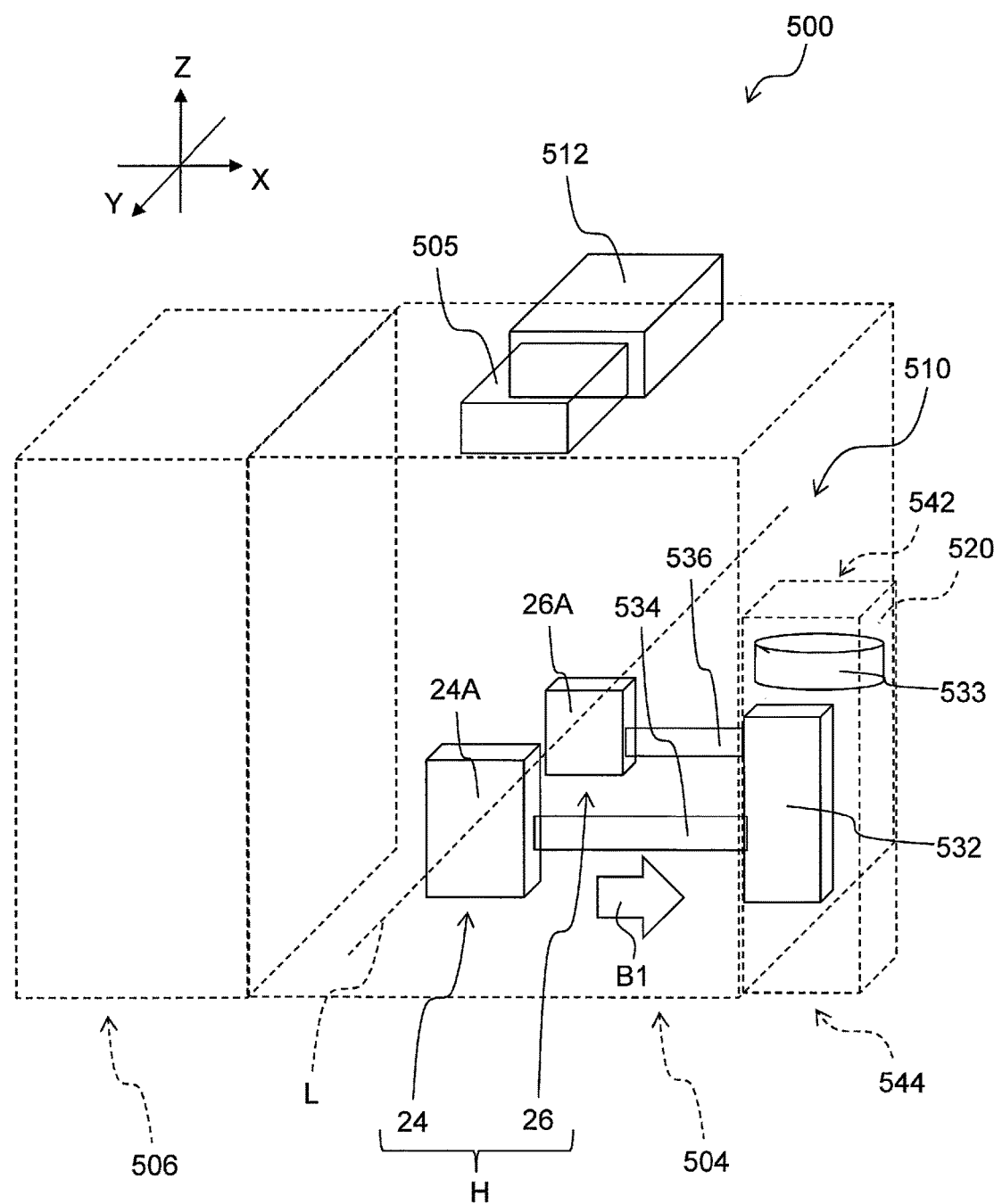
FIG. 35 is a perspective view schematically illustrating the layout of the imaging device according to the second embodiment.

As illustrated in FIG. 35, the image sensor 24 and the image engine 26 as the heat source H are provided inside the imaging main body 504, and a heat sink 532 and a fan 533 are provided inside the duct 520 provided on the side of the imaging main body 504.

Two heat transfer members 534 and 536 that connect the heat source H and the heat sink 532 are provided inside the imaging main body 504. A first heat transfer member 534 transfers the heat of the image sensor 24 to the heat sink 532, and a second heat transfer member 536 transfers the heat of the image engine 26 to the heat sink 532. Similarly to the heat transfer members 34 and 36 of the first embodiment, the heat transfer members 534 and 536 may be formed of a material having high thermal conductivity (for example, graphite).

As illustrated in FIG. 35, both of the heat transfer members 534 and 536 extend from the heat source H in the direction (as shown by arrow B1) along the main surfaces 24A and 26A and are connected to the heat sink 532. The heat sink 532 is disposed on the outer peripheral side of the imaging main body 504 with respect to the heat source H. That is, the heat dissipation mechanism 510 having the heat sink 532 is disposed on the outer peripheral portion of the imaging main body 504.

According to such a configuration, similarly to the first embodiment, while the heat dissipation is secured by the heat dissipation mechanism 510 including the heat sink 532 and the fan 533, the thickness of the imaging device 500 in the front-rear direction is suppressed to be small, so that the imaging device 500 can be made compact. This makes it possible to realize the imaging device 500 that easily achieves both the heat dissipation and the designability.

As in the first and second embodiments, the heat dissipation mechanism for dissipating heat from the heat source H such as the image sensor 24 and the image engine 26 is disposed at the central upper portion of the imaging main body (according to first embodiment) or on a side opposite to the side in which the grip is provided with respect to the imaging main body (according to second embodiment), so that it is possible to realize the imaging device that easily achieves both the heat dissipation and the designability.

Modification of Second Embodiment

Figure 36:
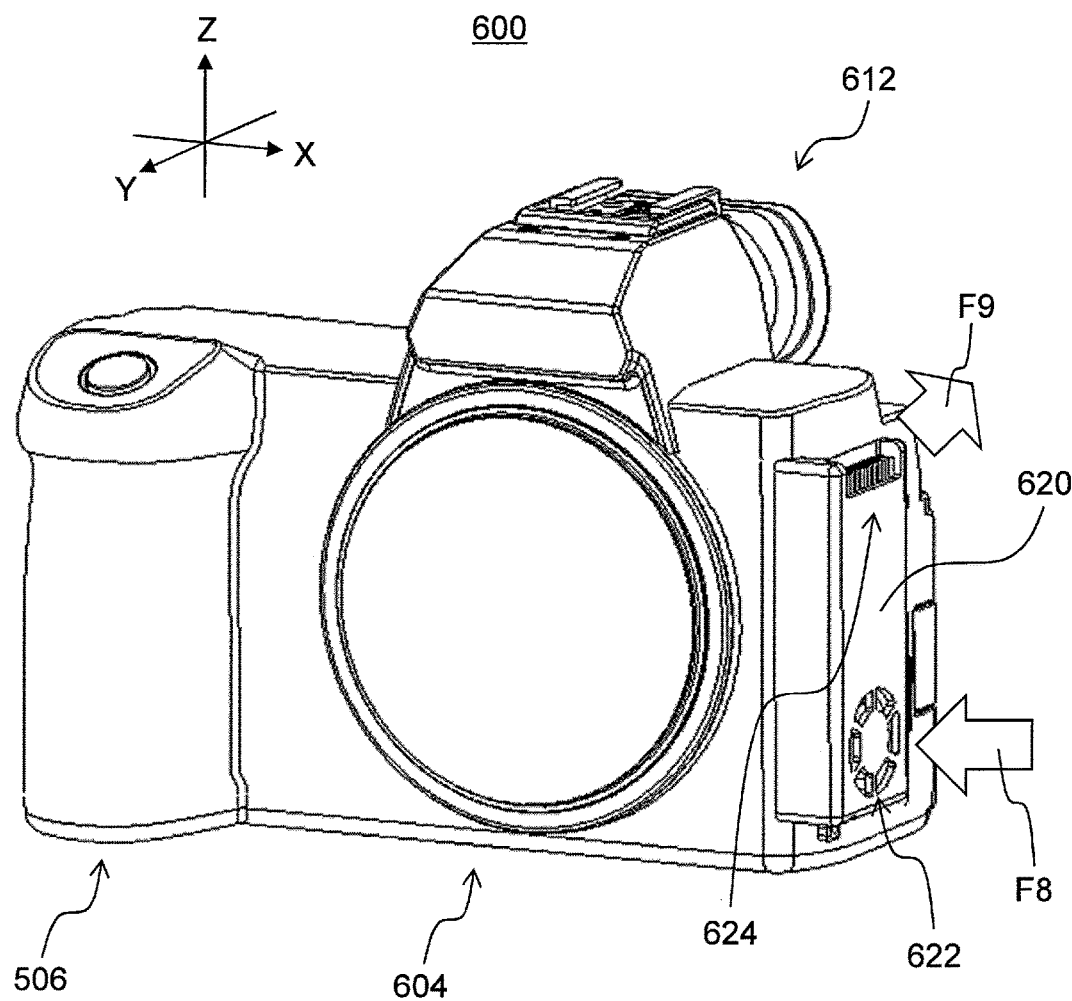
FIG. 36 is a perspective view illustrating the imaging device according to a modification of the second embodiment.

In the second embodiment, an example in which the duct 520 draws air from above and exhausts the air downward (as shown by arrows F6 and F7) has been described, but the direction of intake and exhaust is not limited to this. For example, as in an imaging device 600 according to the modification of FIG. 36, in a duct 620 provided on the side of an imaging main body 604, an intake port 622 may draw air from a lateral direction (as shown by arrow F8), and an exhaust port 624 may exhaust air upward or obliquely upward (as shown by arrow F9). In the case of the configuration illustrated in FIG. 36, a fan (not illustrated) provided inside the duct 620 may be a centrifugal fan. As described above, even in a case where the duct 620 is provided on the side of the imaging main body 604, the direction of intake and exhaust can be arranged in an arbitrary direction, and the arrangement and specification of the heat sink and the fan are only required to be appropriately changed according to the direction.

Hereinabove, although the present disclosure has been described with reference to the first and second embodiments and modifications thereof described above, the present disclosure is not limited to the first and second embodiments and modifications thereof described above. For example, the imaging device may not include the EVF unit 12. Further, in a case where the imaging device 2 includes the EVF unit 12, a third heat transfer member that connects the EVF unit 12 to the heat sink 32 through an independent heat dissipation path may be provided separately from the heat transfer members 34 and 36.

Further, in the first and second embodiments, a case where the imaging device 2 includes the grip 6 has been described, but the present disclosure is not limited to such a case, and the imaging device 2 may not include the grip 6.

Furthermore, in the first and second embodiments, a case where the image sensor 24 and the image engine 26 dissipate heat by the same heat dissipation mechanism 10 has been described, but the present disclosure is not limited to such a case. For example, one member of the image sensor 24 and the image engine 26 may dissipate heat by the heat dissipation mechanism 10 (for example, the central upper portion of the imaging main body 4), and the other member may dissipate heat by another heat dissipation mechanism (for example, a rear side of the imaging main body 4).

Further, in the first and second embodiments, a case where the heat source H is the image sensor 24 and the image engine 26 has been described, but the present disclosure is not limited to such a case, and may include another heat source (for example, a housing unit for a recording medium). The heat source H may include at least three heat sources including the image sensor 24 (that is, first heat source), the image engine 26 (that is, second heat source), and the housing unit for the recording medium (that is, third heat source), and main surfaces of these heat sources may extend in the direction intersecting the optical axis L. Note that the image engine 26 (that is, processor) and the housing unit may be mounted on a substrate separate from the main substrate 30.

Although the present disclosure has been fully described in connection with the preferred embodiments with reference to the accompanying drawings, various variations and modifications will be apparent to those skilled in the art. It should be understood that such variations and modifications are included within the present disclosure as long as they do not depart from the scope of the present disclosure as set forth in the appended claims. In addition, combinations and changes in order of elements in each embodiment can be realized without departing from the scope and spirit of the present disclosure.

Note that by appropriately combining arbitrary embodiments and modifications among the embodiments and various modifications, effects of the respective embodiments and modifications can be obtained.

The present disclosure is applicable to the imaging device such as a digital camera that captures an image of the subject.

What is claimed is:
1. An imaging device comprising:
a heat source;
a heat dissipation mechanism for dissipating heat of the heat source;
a main body housing which includes the heat source,
a fan housing provided on the upper portion of the main body housing; and
an intake port for drawing air and an exhaust port for discharging air, wherein the heat dissipation mechanism includes a heat sink, a fan, and a heat transfer member that transfers heat of the heat source to the heat sink, wherein the fan housing includes the fan, the intake port, the exhaust port and the heat sink, wherein the fan housing is a protruding portion having multiple surfaces formed by protruding from the main body housing at the upper portion of the main body housing, wherein the intake port and the exhaust port are provided on different surfaces among the multiple surfaces, wherein the multiple surfaces include an upper surface, a lateral surface, and a lower surface, and wherein the intake port is provided on the lower surface among the multiple surfaces and the exhaust port is provided on the lateral surface among the multiple surfaces.

2. The imaging device according to claim 1, wherein the heat dissipation mechanism is disposed at a central upper portion of the main body housing.

3. The imaging device according to claim 2, further comprising an EVF unit, wherein the heat dissipation mechanism is disposed in front of the EVF unit.

4. The imaging device according to claim 2, wherein the heat dissipation mechanism is disposed directly above an optical axis.

5. The imaging device according to claim 1, further comprising a grip provided on a side of the main body housing, wherein the heat dissipation mechanism is disposed at the central upper portion of the main body housing or on a side opposite to the grip with respect to the main body housing.

6. The imaging device according to claim 1, wherein the heat source has a main surface extending in a direction intersecting an optical axis direction, and the heat transfer member extends from the heat source in a direction along the main surface and is connected to the heat sink.

7. The imaging device according to claim 6, wherein the heat source includes at least a first heat source and a second heat source, and the heat transfer member includes a first heat transfer member that transfers heat of the first heat source to the heat sink, and a second heat transfer member that transfers heat of the second heat source to the heat sink.

8. The imaging device according to claim 6, further comprising a sensor substrate that supports an image sensor as the heat source, wherein the heat transfer member includes a follower that follows movement of the sensor substrate driven by BIS control, and a sheet attached to the heat sink.

9. The imaging device according to claim 1, wherein the intake port and the exhaust port are located in a place that is difficult to see in a front view of the fan housing.

10. The imaging device according to claim 1, wherein the heat sink includes a plurality of fins, wherein the fan applies air to the fins by blowing the air to the fins.

11. The imaging device according to claim 1, further comprising a duct that connects the intake port and the exhaust port and passes through the heat sink, wherein the fan housing includes the duct.

12. An imaging device comprising:

a heat source;

a heat dissipation mechanism for dissipating heat of the heat source;

a main body housing which includes the heat source, a fan housing provided on the upper portion of the main body housing; and an intake port for drawing air and an exhaust port for discharging air, wherein the heat dissipation mechanism includes a heat sink, a fan, and a heat transfer member that transfers heat of the heat source to the heat sink, wherein the fan housing includes the fan, the intake port, the exhaust port and the heat sink, wherein the fan housing is a protruding portion having multiple surfaces formed by protruding from the main body housing at the upper part of the main body housing, wherein the intake port and the exhaust port are provided on different surfaces among the multiple surfaces, and wherein the intake port takes in air in a first axial direction, and the exhaust port exhausts air in a second axial direction that is 90 degrees different from the first axial direction.

13. The imaging device according to claim 12, wherein a number of the intake port is one, and a number of the exhaust port is two.

* * * * *